United States Patent
Shimatsu et al.

(10) Patent No.: US 11,450,643 B2
(45) Date of Patent: Sep. 20, 2022

(54) CHEMICAL BONDING METHOD AND JOINED STRUCTURE

(71) Applicants: TOHOKU UNIVERSITY, Sendai (JP); CANON ANELVA CORPORATION, Kawasaki (JP)

(72) Inventors: Takehito Shimatsu, Sendai (JP); Miyuki Uomoto, Sendai (JP); Kazuo Miyamoto, Saitama (JP); Yoshikazu Miyamoto, Saitama (JP); Nobuhiko Katoh, Kawasaki (JP); Takayuki Moriwaki, Kawasaki (JP); Takayuki Saitoh, Kawasaki (JP)

(73) Assignees: TOHOKU UNIVERSITY, Sendai (JP); CANON ANELVA CORPORATION, Kawasaki (JP)

( * ) Notice: Subject to any disclaimer, the term of this patent is extended or adjusted under 35 U.S.C. 154(b) by 0 days.

(21) Appl. No.: 17/670,593

(22) Filed: Feb. 14, 2022

(65) Prior Publication Data

US 2022/0199569 A1    Jun. 23, 2022

Related U.S. Application Data

(63) Continuation of application No. 17/592,881, filed on Feb. 4, 2022, which is a continuation of application No. PCT/JP2020/033471, filed on Sep. 3, 2020.

(30) Foreign Application Priority Data

Sep. 5, 2019   (JP) .............................. JP2019-162065
Jun. 4, 2020   (JP) .............................. JP2020-098031

(51) Int. Cl.
*H01L 23/00*    (2006.01)
*C23C 14/08*    (2006.01)
(Continued)

(52) U.S. Cl.
CPC .............. *H01L 24/83* (2013.01); *C23C 14/08* (2013.01); *C23C 14/34* (2013.01);
(Continued)

(58) Field of Classification Search
CPC ............ H01L 2224/29188; H01L 2224/29687
See application file for complete search history.

(56) References Cited

U.S. PATENT DOCUMENTS

2012/0205747 A1    8/2012   Yamada et al.
2019/0172813 A1    6/2019   Utsumi et al.

FOREIGN PATENT DOCUMENTS

CN    102498542 A    6/2012
CN    109690731 A    4/2019
(Continued)

OTHER PUBLICATIONS

International Preliminary Report on Patentability (Form PCT/IPEA/416) and (Form PCT/IPEA/409) dated Aug. 10, 2021, by the Japan Patent Office as the International Searching Authority for International Application No. PCT/JP2020/033471.
(Continued)

*Primary Examiner* — Amar Movva
(74) *Attorney, Agent, or Firm* — Buchanan Ingersoll & Rooney PC

(57) ABSTRACT

A bonded structure includes a first substrate; a second substrate placed opposite to the first substrate; an intermediate layer provided between the first substrate and the second substrate and including a first oxide thin film layered on the first substrate and a second oxide thin film layered on the second substrate; either or both of the first oxide thin film
(Continued)

and the second oxide thin film of the intermediate layer being formed of oxide thin films having increased defects; and an interface between the first oxide thin film and the second oxide thin film=being bonded by chemical bonding, and the interface comprising a low-density portion whose density is lower than that of the two oxide thin films.

12 Claims, 17 Drawing Sheets

(51) Int. Cl.
   *C23C 14/34*  (2006.01)
   *C23C 14/58*  (2006.01)
(52) U.S. Cl.
   CPC .......... *C23C 14/5893* (2013.01); *H01L 24/32* (2013.01); *H01L 24/29* (2013.01); *H01L 2224/2957* (2013.01); *H01L 2224/29186* (2013.01); *H01L 2224/29188* (2013.01); *H01L 2224/29541* (2013.01); *H01L 2224/29687* (2013.01); *H01L 2224/32145* (2013.01); *H01L 2224/8383* (2013.01); *H01L 2224/83097* (2013.01); *H01L 2224/83099* (2013.01); *H01L 2224/83896* (2013.01)

(56) References Cited

FOREIGN PATENT DOCUMENTS

| | | |
|---|---|---|
| EP | 3493242 A1 | 6/2019 |
| JP | 5401661 B2 | 11/2013 |
| JP | 5569964 B2 | 7/2014 |
| JP | 2015222970 A | 12/2015 |
| KR | 1020120049899 A | 5/2012 |
| WO | 2011027871 A1 | 3/2011 |
| WO | 2018020780 A1 | 2/2018 |

OTHER PUBLICATIONS

International Search Report (PCT/ISA/210) with translation and Written Opinion (PCT/ISA/237) dated Dec. 8, 2020, by the Japan Patent Office as the International Searching Authority for International Application No. PCT/JP2020/033471.

Low-density portion

Low-density portion

CHEMICAL BONDING METHOD AND JOINED STRUCTURE

CROSS-REFERENCE TO RELATED APPLICATIONS

The present application is a continuation of U.S. application Ser. No. 17/592,881, filed on Feb. 4, 2022, which is a continuation of PCT/JP2020/033471, filed on Sep. 3, 2020, and which claims the priority of JP 2019-162065, filed on Sep. 5, 2019, and JP 2020-098031, filed on Jun. 4, 2020. The subject matter of U.S. application Ser. No. 17/592,881; PCT/JP2020/033471; JP 2019-162065; and JP 2020-098031 is incorporated herein by reference.

FIELD OF THE INVENTION

This invention relates to a chemical bonding method and a bonded structure having a bonded portion bonded by the chemical bonding method, and more specifically to an improved atomic diffusion bonding method in which a thin film of metal or semi-metal formed in a vacuum vessel on the bonding surface of one of the substrates to be bonded is superimposed on a thin film of metal or semi-metal formed on the other substrate or on the bonding surface of the other substrate for bonding, and to a bonded structure having a bonded portion bonded by this improved chemical bonding method.

BACKGROUND OF THE INVENTION

Bonding techniques that bond two or more materials to be bonded are used in various fields, and such bonding techniques are used for, for example, wafer bonding and package sealing in the field of electronic components.

Taking the above-described wafer bonding technique as an example, the related-art general wafer bonding technique is to apply high pressure and high heat between superimposed wafers to bond them.

However, this method of bonding cannot be used to bond or integrate substrates provided with electronic devices that are sensitive to heat or pressure. Therefore, there is a need for a technique to bond the substrates to be bonded without physical damage such as heat or pressure.

As one of such bonding techniques, a bonding method called "atomic diffusion bonding" has been proposed.

In this atomic diffusion bonding, a microcrystalline thin film (hereinafter referred to as the "bonding film") of metal or semi-metal with a thickness of the nano-order is formed on a smooth surface of one of the wafers, chips, substrates, packages, or other various materials (hereinafter referred to as "substrate") to be bonded by vacuum deposition such as sputtering or ion plating, and the thin film is superimposed on a bonding film formed on a smooth surface of other substrate or on a smooth surface of a substrate with a microcrystalline structure in the same vacuum as that used to form the bonding film, or under atmospheric pressure, thereby allowing bonding with atomic diffusion at the bonding interface and grain boundaries (see Patent Documents 1 and 2).

This atomic diffusion bonding can be used to bond any materials to be bonded that allow the formation of the above-described bonding film in a vacuum. Therefore, not only semiconductor and ceramics wafers, but also metals, ceramics blocks (substrates), polymers, and various other materials can be bonded, and in addition to bonding similar materials, different materials can be bonded without heating, preferably at room temperature (or low temperature).

Atoms of a metal in the solid phase can hardly move at room temperature. However, in atomic diffusion bonding, the large surface energy of the bonding film formed in a vacuum vessel is used as the driving force for bonding, and bonding is performed by transferring the atoms of the materials constituting the bonding film at room temperature using the large atomic diffusion performance on the surface of the bonding film and the crystal lattice rearrangement at the contact interface.

The atomic diffusion and crystal lattice rearrangement on the surface are low-energy, high-speed movements of atomic defects (vacancies) on the surface and at the bonding interface, which can be used to move metal atoms and bond them at room temperature.

Atomic diffusion bonding can be performed at room temperature using a bonding film of any metal. In particular, materials with larger atomic self-diffusion coefficients, such as Ti and Au, allow for easier atomic movement and rearrangement of crystal lattice at the bonding interface, resulting in higher bonding performance.

Among these atomic diffusion bonding methods, bonding in a vacuum using a thin metal film of about a few angstroms (a few angstroms per side when bonding films together) as the bonding film on the bonding surface produces a bonding interface that is transparent and has almost no electrical conductivity, and is therefore being considered for use in bonding optical components and new functional devices.

However, even if the bonding film at the bonding interface is a thin metal film of only a few angstroms on each side, the thin film has characteristics similar to those of metal, which means that about 1 to 2% of light is absorbed at the bonding interface and a small amount of electrical conductivity remains, and this small amount of remaining light absorption and conductivity can be a problem in the formation of high brightness devices and electronic devices.

In order to solve this problem, a method for producing an elastic wave device has been proposed (Patent Document 3), in which the metal bonding film existing at the bonding interface is oxidized after bonding by atomic diffusion bonding to make it lose conductivity, thereby preventing characteristic degradation due to leakage of high frequency signals into the metal bonding film.

Specifically, Patent Document 3 discloses a method for producing an elastic wave device by laminating a thin film of piezoelectric material and a support substrate; first, an oxide base layer is formed on both bonding surfaces, and then a metal bonding film is formed on top of the oxide base layer, and then the bonding films are superimposed on each other for atomic diffusion bonding. Thereafter, heat treatment is performed and the bonding films are oxidized by the oxygen that deviates from the oxide base layer during the heat treatment to form a metal oxide film, thereby eliminating the degradation of the characteristics of the elastic wave device caused by the presence of metal bonding films at the bonding interface (see paragraphs [0012] to [0018], [0028] of Patent Document 3).

RELATED ART DOCUMENTS

Patent Document

[Patent Document 1] Japanese Patent No. 5401661
[Patent Document 2] Japanese Patent No. 5569964

[Patent Document 3] Japanese Patent KOKAI No. 2015-222970 (LOPI; automatically published after around 18 months from filing date regardless prosecution)

SUMMARY OF THE INVENTION

Problems to be Solved by the Invention

In the bonding method of the piezoelectric material and the support substrate used in the method for producing an elastic wave device described in the above-described Patent Document 3, the metal bonding film existing at the bonding interface is oxidized by heat treatment after atomic diffusion bonding, and the characteristic degradation caused by the presence of the metal bonding film at the bonding interface can be favorably eliminated.

However, this bonding method not only requires thickness control to form a very thin metal bonding film of a few A, but also requires a new process to form an oxidation base film, heat treatment for oxidation after atomic diffusion bonding, and control to stably supply the bonding film with the amount of oxygen that deviates from the oxidation base film during the heat treatment. As a result, there are many parameters that need to be controlled for mass production, and these become obstacles in increasing productivity.

The reason for the formation of an oxide base layer, the addition of a new heat treatment process after atomic diffusion bonding, and the need for complex parameter management during the heat treatment and others is to oxidize the metal bonding film that exists at the bonding interface after atomic diffusion bonding. If atomic diffusion bonding can be performed using a bonding film formed by oxides from the beginning, there is no need to oxidize the bonding film after the bonding, which eliminates the need for the process of forming the oxidized base layer, the heat treatment for oxidation, and the complicated work of managing the parameters during the heat treatment.

Thus, in order to perform atomic diffusion bonding using the oxide thin film as the bonding film, atoms must move around on the surface of the oxide thin film and cause chemical bonding with the surface of the other oxide thin film (or substrate).

However, the atomic diffusion bonding described in the above-described Patent Documents 1 and 2 is based on the premise that the bonding film formed on the bonding surface is formed of metal or semi-metal. These literatures not only suggest that it is not possible to form a bonding film with an oxide or to perform atomic diffusion bonding with a oxide thin film, but also neither disclose nor suggest that atomic diffusion bonding is possible with a bonding film formed with such an oxide.

That is, in atomic diffusion bonding, metal atoms are transferred and bonded at room temperature by utilizing the large atomic diffusion performance on the surface of the bonding film and the crystal lattice rearrangement at the contact interface, as described above. Therefore, the bonding film formed on the bonding surface must be one that easily causes atomic diffusion, and it was thought that the higher the surface diffusion coefficient, which indicates the ease of atomic diffusion, the easier it is for atoms to be bonded, and the lower the surface diffusion coefficient, the less likely atoms are to be bonded at room temperature.

Therefore, the above-described Patent Documents 1 and 2 specify the bonding conditions according to the surface diffusion coefficient Ds of a metal or semi-metal that is the material of the bonding film, and describe that it is desirable to increase the surface diffusion coefficient by heating when bonding using a metal or semi-metal bonding film with a low surface diffusion coefficient Ds at room temperature (claim 4 of Patent Document 1), and that the heating temperature conditions during bonding should be increased along with the decrease in the surface diffusion coefficient (paragraphs [0070] to [0073] of Patent Document 2).

Thus, Patent Document 1 and Patent Document 2 suggest that even when bonding is performed using a bonding film composed of a non-oxidized metal or semi-metal, bonding may not be possible at room temperature when the bonding film is formed with a material with a small surface diffusion coefficient.

In contrast to the surface diffusion coefficients Ds of metals and semi-metals, the surface diffusion coefficients of these oxides are remarkably low. As an example, as shown in Table 1 below, for iron (Fe), the surface diffusion coefficient Ds of atoms on the individual surface of its oxide, iron oxide ($Fe_2O_3$), is much lower than that of either the γ-structure, which is a high-temperature phase, or the α-structure, which is stable near room temperature, and is 11 orders of magnitude smaller than that of the γ-structure and 13 orders of magnitude smaller than that of the α-structure.

TABLE 1

| Element | Surface diffusion coefficient Ds ($cm^2/s$) | Temperature (° C.) | Literature* |
|---|---|---|---|
| $Fe_2O_3$ oxide | $10^{-8}$ | 900 to 1100 | (1) |
| Fe (γ structure) | $4 \times 10^3$ | 920 to 1100 | (2) |
| Fe (α structure) | $10^5$ | 740 to 880 | (2) |

*Literature (1): Yasuro Ikuma, Wazo Komatsu, "Surface Diffusion and Surface Layers in Ceramic Materials," Journal of the Surface Science Society of Japan, Vol. 5, No. 1, pp. 12-21 (1984).
*Literature (2): Kenichi Hirano, Ryoji Tanaka, "Surface Diffusion of Metals", Bulletin of the Japan Institute of Metals and Materials, Vol. 9, No. 6, pp. 341-358 (1970)

Table 1 above shows the surface diffusion coefficients Ds at high temperatures that can be evaluated experimentally. Even at room temperature, the surface diffusion coefficient Ds of iron oxide ($Fe_2O_3$) is still an order of magnitude smaller than that of iron (Fe), and this relationship applies not only to iron and iron oxide, but also to other metals and semi-metals and their oxides.

Therefore, it is the understanding of the person skilled in the art, including the inventors of the present invention, that even if bonding films composed of a metal or semi-metal oxide are superimposed on each other, no atomic movement occurs, and therefore, atomic diffusion bonding cannot be performed. Based on this understanding, as introduced in Patent Document 3 above, development has been carried out on the premise that, in atomic diffusion bonding, the only way to form a bonding film at the bonding interface with an oxide is to oxidize the bonding film after the bonding is completed.

However, as a result of intensive research by the inventors of the present invention, it was found that, contrary to the recognition of the person skilled in the art as described above, under certain conditions, an unexpected result could be obtained in which chemical bonding could be performed even when the bonding film was initially formed with an oxide.

The present invention is based on the above findings obtained as a result of research by the inventors, and aims to provide a chemical bonding method that enables bonding by means of an oxide thin film, thereby obtaining a bonded structure in which the bonding interface is bonded through an oxide thin film without the formation of an oxide base layer or heat treatment for oxidation after bonding, and without complicated parameter management associated with heat treatment for oxidation.

Means for Solving the Problem

In order to achieve the object, a chemical bonding method of the present invention comprises; in a vacuum vessel, forming amorphous oxide thin films having increased defects and facilitating movement of atoms on smooth surfaces of two substrates each having a smooth surface, and superimposing the two substrates so that the amorphous oxide thin films formed on the two substrates are in contact with each other, thereby causing chemical bonding at a bonding interface between the amorphous oxide thin films to bond the two substrates.

Immediately after film formation, fine crystals may be partially formed inside the amorphous oxide thin film. However, such partially existing fine crystals do not interfere with chemical bonding, and a thin film that partially contains such fine crystals is included in the amorphous oxide thin film in the present invention.

Furthermore, a chemical bonding method of the present invention comprises; in a vacuum vessel, forming an amorphous oxide thin film having increased defects and facilitating movement of atoms on a smooth surface of one substrate, and superimposing two substrates so that the amorphous oxide thin film formed on the one substrate contacts a smooth surface of other substrate having a smooth surface with an oxide thin film at least on its surface, thereby causing chemical bonding at a bonding interface between the amorphous oxide thin film and the smooth surface of the other substrate to bond the two substrates.

Moreover, a chemical bonding method of the present invention comprises; in a vacuum vessel, forming an amorphous oxide thin film having increased defects and facilitating movement of atoms on a smooth surface of one substrate, and superimposing two substrates so that the amorphous oxide thin film formed on the one substrate contacts a smooth surface of other substrate having an activated smooth surface, thereby causing chemical bonding at a bonding interface between the amorphous oxide thin film and the smooth surface of the other substrate to bond the two substrates.

In any of the above chemical bonding methods, preferably, the chemical bonding involves atomic diffusion at the bonding interface.

Furthermore, in any of the above chemical bonding methods, preferably, arithmetic mean roughness of the surface of the amorphous oxide thin film is 0.5 nm or less.

Preferably, the amorphous oxide thin film may be formed by a method involving rapid cooling of raw material atoms on the smooth surface of the substrate, furthermore, preferably, bonding is performed by forming the amorphous oxide thin film having increased defects on the smooth surface of the substrate. In such a defective amorphous oxide thin film, the state of chemical bonding on the surface is not stabilized and there are many broken chemical bonds, which can easily cause chemical bonding with the surface of the other amorphous oxide thin film (or the activated substrate).

The superimposing of the substrates may be performed without heating the substrates, or the substrates may be heated when the substrates are superimposed at a temperature from room temperature to 400° C. to accelerate the chemical bonding.

Preferably, forming the amorphous oxide thin film and superimposing the substrates is performed in a vacuum vessel with an ultimate vacuum pressure of from $1 \times 10^{-3}$ Pa to $1 \times 10^{-8}$ Pa. Furthermore, formation of the amorphous oxide thin films and the superposition of the substrates are preferably performed in the same vacuum.

Preferably, a difference in electronegativity between oxygen and one or more of elements other than oxygen constituting the amorphous oxide thin film is 1.4 or more, or ionicity defined in the following equation is 40% or more:

$$\text{Ionicity (\%)} = [1 - \exp\{-0.25(B-A)^2\}] \times 100$$

wherein A is the electronegativity of one or more of the elements other than oxygen constituting the amorphous oxide thin film, and B is the electronegativity of oxygen.

The amorphous oxide thin film may comprise one or more elements selected from the element group of Be, Mg, Al, Sc, Ti, V, Cr, Mn, Zn, Y, Zr, Nb, Hf, Ta, Li, Na, K, Ca, Rh, Sr, Cs, Ba, Fe, Co, Ni, Cu, Ag, Ge, Ga, In, Sn, B, Si.

Preferably, a thickness of the amorphous oxide thin film is from 0.3 nm to 5 μm, more preferably, from 0.5 nm to 1 μm.

A bonded structure of the present invention comprises:
a first substrate;
a second substrate placed opposite to the first substrate;
an intermediate layer provided between the first substrate and the second substrate and including a first oxide thin film layered on the first substrate and a second oxide thin film layered on the second substrate;
either or both of the first oxide thin film and the second oxide thin film of the intermediate layer being formed of oxide thin films having increased defects;
an interface between the first oxide thin film and the second oxide thin film being bonded by chemical bonding, and the interface comprising a low-density portion whose density is lower than that of the two oxide thin films.

Another bonded structure of the present invention comprises:
a first substrate;
a second substrate placed opposite to the first substrate;
an intermediate layer provided between the first substrate and the second substrate and including an oxide thin film having increased defects layered on the first substrate;
an interface between the oxide thin film of the intermediate layer and the second substrate being bonded by chemical bonding, and the oxide thin film at the bonded portion having a low-density portion whose density is lower than that of the oxide thin film.

Furthermore, preferably, the interface between the first oxide thin film and the second oxide thin film of the intermediate layer is bonded by chemical bonding with atomic diffusion.

The interface between the oxide thin film of the intermediate layer and the second substrate may be bonded by chemical bonding with atomic diffusion.

In the bonded structures, a material constituting the oxide thin film of the intermediate layer may be different from a material constituting the first substrate or the second substrate.

Effect of the Invention

According to the configuration of the present invention as described above, in the chemical bonding method of the present invention, the bonding film formed on a smooth surface of a substrate is an amorphous oxide thin film formed in a vacuum vessel, which enables chemical bonding to be performed without heating even with an oxide thin film that was thought to be incapable of chemical bonding due to its low surface diffusion coefficient.

As a result, a bonded structure with an oxide thin film formed at the bonding interface was obtained without the need for an oxide base layer, heat treatment after bonding, or complicated parameter management during heat treatment.

Thus, the thin film at the bonding interface can be an oxide thin film, and the bonding interface can be formed by an oxide thin film without light absorption or conductivity, thereby expanding the range of application of atomic diffusion bonding by chemical bonding to high brightness devices, optical devices, electronic devices, and other devices where light absorption and conductivity at the bonding interface cause functional degradation.

It has already been mentioned that in order for chemical bonding to occur by an amorphous oxide thin film, it is necessary for atoms to move easily on the surface of the contacting oxide thin film and for chemical bonding such as ionic bonding and covalent bonding to occur with the surface of the other oxide thin film (or substrate).

Whether it is an amorphous structure or a crystalline structure, the most stable composition for an oxide thin film is the one determined stoichiometrically by the valence of oxygen and the elements such as metals that form the oxide, and in this stable composition, atoms do not move easily, and therefore, chemical bonding is difficult to occur.

However, in an amorphous oxide thin film formed by rapid cooling of high-temperature raw material atoms sputtered from a target surface by sputtering or the like on a substrate surface, a thin film having increased defects, such as a state in which oxygen is missing or oversaturated compared to the above-described stoichiometric composition.

In such a thin film having increased defects, there is a large fluctuation in the bonding state between the ions of elements such as metals and oxygen, which facilitates the movement of atoms on the surface of the thin film, thus making chemical bonding easier to occur. Therefore, even though an oxide thin film is used, atoms are transferred at the bonding interface and stable chemical bonding is obtained, which is thought to be the reason why the two substrates can be bonded firmly.

In particular, when atomic diffusion occurred at the bonding interface, the bonding strength could be improved by stabilizing the chemical bonding over a wider range.

In oxides, since the binding energy between the metal or semi-metal element and oxygen is large, the diffused atoms are immediately trapped by nearby heteroatoms, and the range in which they can move is very short, making it difficult for them to bond with heteroatoms at distant locations.

Therefore, when the surface of the amorphous oxide thin film is rough and there is even a small gap at the bonding interface, the bonding strength will decrease even if bonding is possible because chemical bonding does not occur in this area.

However, in the configuration where the arithmetic mean roughness of the surface of the above-described amorphous oxide thin film was 0.5 nm or less, it was possible to make contact with the entire area of the film surface at the atomic level during bonding, resulting in strong chemical bonding.

In the chemical bonding method of the present invention, bonding can be performed even when no heat treatment is performed after bonding, however by performing heat treatment at 400° C. or lower after bonding, the chemical bonding at the bonding interface is further enhanced, resulting in even stronger bonding.

EMBODIMENTS FOR CARRYING OUT THE INVENTION

Figure 1:
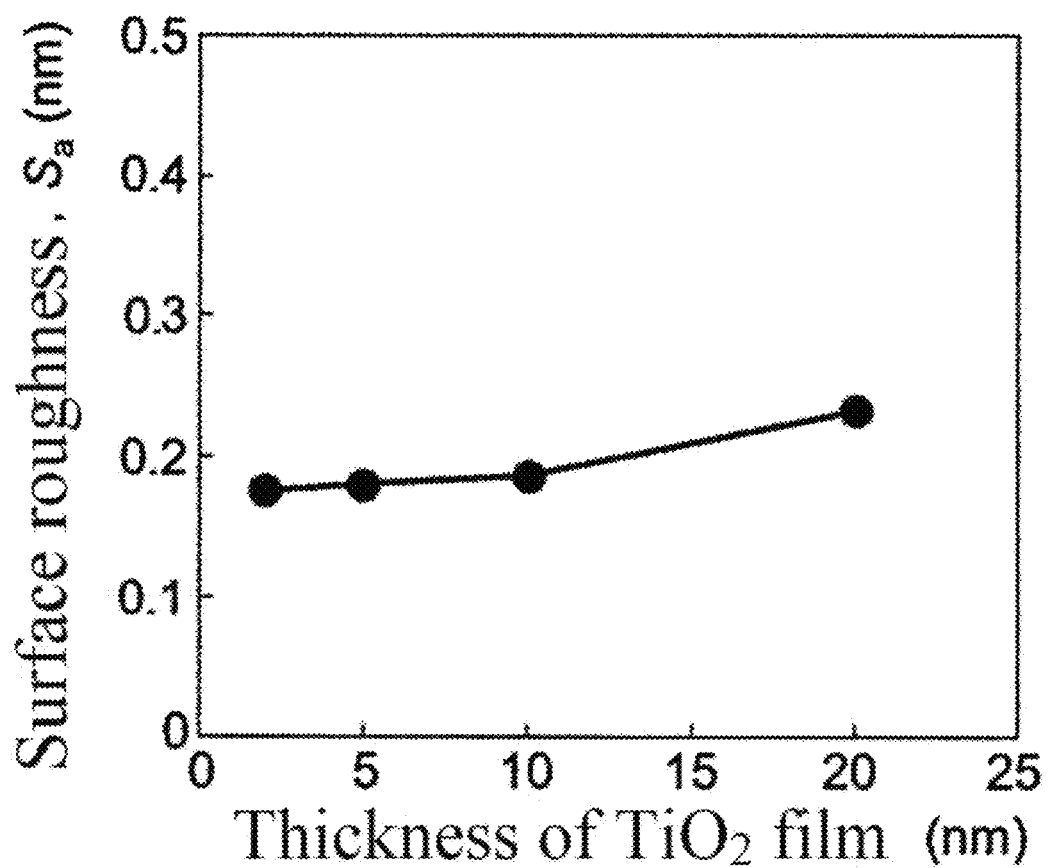
FIG. 1 shows the correlation between thickness and surface roughness (arithmetic mean height Sa) of an amorphous oxide thin film ($TiO_2$ thin film).

The chemical bonding method of the present invention is described below.

[Overview of Bonding Method]

The chemical bonding method of the present invention performs chemical bonding using an amorphous oxide thin film formed by vacuum film deposition such as sputtering or ion plating in a vacuum vessel, including superimposing the amorphous oxide thin films formed on smooth surfaces of two substrates to be bonded, or superimposing the amorphous oxide thin film (first oxide thin film) formed on the smooth surface of one of the substrates to be bonded on the smooth surface with an oxide thin film (second oxide thin film) formed on the other substrate, furthermore, superimposing the amorphous oxide thin film formed on the smooth surface of one of the substrates to be bonded on the smooth surface of the other substrate having an activated smooth surface to generate chemical bonding, preferably chemical bonding with atomic diffusion at the bonding interface to bond the two substrates.

[Substrate (Material to be Bonded)]

(1) Material

The substrate to be bonded by the chemical bonding method of the present invention may be any material on which the above-described amorphous oxide thin film can be formed by sputtering, ion plating, etc., in a high vacuum atmosphere using a vacuum vessel with an ultimate vacuum of from $1 \times 10^{-3}$ to $1 \times 10^{-8}$ Pa, preferably from $1 \times 10^{-4}$ to $1 \times 10^{-8}$ Pa, as an example. In addition to various pure metals and alloys, semiconductors such as Si wafers and $SiO_2$ substrates, glass, ceramics, resins, oxides, etc. that can be vacuum deposited using the above method may be used as the substrate (material to be bonded) in the present invention.

The substrate can be bonded not only between the same materials, such as metal to metal, but also between different materials, such as metal and ceramics.

(2) State and Other Properties of Bonding Surface

The shape of the substrate is not particularly limited, and may be any shape from a flat plate to various complex three-dimensional shapes, depending on the application and purpose. However, the part to be bonded with the other substrate (bonding surface) must have a smooth surface formed with a predetermined accuracy.

This smooth surface, which is bonded to another substrate, may be provided on one substrate to bond multiple substrates to one substrate.

This smooth surface is formed to surface roughness that enables the surface roughness of the formed amorphous oxide thin film to be 0.5 nm or less in arithmetic mean height Sa (ISO 4287) when the amorphous oxide thin film described below is formed on this smooth surface. When the smooth surface is surface-activated and the above-described amorphous oxide thin film is superimposed on it, the smooth surface of the substrate itself is formed to an arithmetic mean height Sa of 0.5 nm or less.

It is preferable that the gas adsorption layer, natural oxidation layer, or other altered layers are removed from the smooth surface of the substrate before the amorphous oxide thin film is formed. For example, the above-described altered layer can be removed by a known wet process such as washing with chemicals, and after the removal of the above-described altered layer, a substrate that has been hydrogen-terminated to prevent gas adsorption again can be suitably used.

The removal of the altered layer is not limited to the wet process described above, but can also be performed by a dry process, and the altered layer such as the gas adsorption layer and natural oxidation layer can be removed by reverse sputtering or other means through bombarding with rare gas ions in a vacuum vessel.

In particular, when the altered layer is removed by a dry process as described above, in order to prevent gas adsorption and oxidation on the surface of the substrate until the amorphous oxide thin film is formed after the removal of the altered layer, it is preferable to perform the removal of the altered layer in the same vacuum as that used to form the amorphous oxide thin film, and to form the amorphous oxide thin film following the removal of the altered layer, and it is more preferable to remove the altered layer using an ultra-pure inert gas to prevent the re-formation of an oxidized layer or the like after the removal of the altered layer.

The structure that can be bonded to the substrate is not particularly limited and various structures can be bonded to the substrate, including single crystal, polycrystalline, amorphous, and glassy structures. When the amorphous oxide thin film described below is formed on only one of the two substrates and the other substrate is bonded without forming an amorphous oxide thin film, the bonding surface of the other substrate without the thin film must be either formed with an oxide thin film so that chemical bonding occurs, or activated by introducing the substrate, whose surface has been hydrophilically treated outside the vacuum vessel, into the vacuum vessel, or by removing the oxidized and contaminated layers on the substrate surface by dry etching in the same vacuum as that used to form the amorphous oxide thin film, thereby facilitating the occurrence of chemical bonding.

[Amorphous Oxide Thin Film]

(1) General Materials

The amorphous oxide thin film used for bonding may be made of any oxide that is stable in a vacuum and in air, and amorphous oxide thin films formed of various oxides may be used.

(2) Material Selection Based on Electronegativity or Ionicity

Chemical bonding in oxide thin films is a state of coexistence of covalent and ionic bonding. However, in an amorphous oxide thin film with high covalent bonding properties, surface atoms stabilize their energy states by covalently bonding with each other in a two-dimensional manner, making it difficult for chemical bonding to occur at the contact interface when in contact with other amorphous oxide thin film or the surface of the substrate.

Therefore, the more an amorphous oxide thin film with high ionic bonding properties is used for bonding, the higher the bonding performance (bonding strength) becomes. In general, the electronegativity of the elements other than oxygen (oxide-forming elements) that form the oxide of the amorphous oxide thin film is smaller than the electronegativity of oxygen (3.44), and the larger the difference between the two, the greater the ionic connectivity.

When the electronegativity of the above-described oxide-forming elements is A and the electronegativity of oxygen is B, the degree of ionic bonding between them (referred to as "ionicity" in the present invention) is given by the following equation:

$$\text{Ionicity } (\%) = [1 - \exp\{-0.25(B-A)^2\}] \times 100$$

In the chemical bonding of the present invention, it is preferable to bond by forming an amorphous oxide thin film in which the difference (B−A) between the electronegativity B of oxygen and the electronegativity A of the oxide-forming element is 1.4 or more, or the ionicity is 40% or more.

In particular, when high bonding strength is required, bonding is preferably performed by forming an amorphous oxide thin film in which the difference (B−A) between the electronegativity B of oxygen and the electronegativity A of the oxide-forming element is 1.67 or more, or having ionicity of 50% or more.

Examples of the oxide-forming element with a difference (B−A) of 1.67 or more from the electronegativity B of oxygen, or with an ionicity of 50% or more include Be, Mg, Al, Sc, Ti, V, Cr, Mn, Zn, Y, Zr, Nb, Hf, Ta or the like.

Examples of the oxide-forming element with a difference (B−A) of 1.4 or more from the electronegativity B of oxygen, or with an ionicity of 40% or more include, in addition to the oxide-forming elements listed above, Fe, Co, Ni, Cu, Ag, Ge, Ga, In, Sn, B, Si or the like.

In addition, oxides containing alkali metals, alkaline earth metals, and lanthanides, which have extremely high ionic bonding properties, further increase the ionicity, so even better bonding performance can be expected. Examples of the element include Li, Na, K, Ca, Rh, Sr, Cs, Ba, La, Ce, Pr, Nd, Yb or the like.

The amorphous oxide thin film may be a composition-modulated film in which the composition of the forming elements is changed in the thickness or in-plane direction, and in particular, may be a film in which only a few atomic layers of the thin film surface are compositionally modulated to a composition with high ionic bonding.

Alternatively, it may be a multilayer structure with an amorphous oxide thin film with high ionic bonding properties on the surface.

Furthermore, since the spatial atomic positions of amorphous materials are not as clear as those of crystalline materials, chemical bonding can be achieved between amorphous oxide thin films of different materials if chemical bonding can be achieved at the contact interface. Therefore, in a configuration in which an amorphous oxide thin film is formed on each of the smooth surfaces of one substrate and the other substrate for bonding, the amorphous oxide thin film formed on the smooth surface of one substrate (first oxide thin film) and the amorphous oxide thin film formed on the smooth surface of the other substrate (second oxide thin film) may be formed by oxides composed of different oxide-forming elements.

In a configuration where an amorphous oxide thin film is formed on one substrate only, and the amorphous oxide thin film formed on one substrate is superimposed on the smooth surface of the activated other substrate for bonding, the material of the substrate may be an oxide or a semiconductor such as Si, as long as the substrate can be activated to make the surface easy to chemically bond, and the material is not particularly limited.

As described above, since the surface diffusion coefficient of oxide atoms is very small, the bonding interface of the bonded amorphous oxide thin films can have areas of lower density than the density of the amorphous oxide thin films used for bonding (low-density portions), however there are no application problems because bonding can be achieved even with the occurrence of such low-density portions.

(3) Selection Based on the Physical Properties of the Oxide (Optical, Electromechanical, Etc.)

In the above description, from the viewpoint of bonding performance, the amorphous oxide thin film was selected on the basis of its electronegativity or ionicity. The preferred oxide-forming elements may be selected in place of, or in combination with, the above-described selection based on electronegativity or ionicity, taking into account the engineering application aspects (for example, refractive index and electromechanical coefficient).

For example, an amorphous oxide thin film with an appropriate optical refractive index, transmittance, and others is selected for bonding between substrates of optical components that transmit light, and for bonding of electronic devices that apply radio waves, ultrasonic waves, or the like is selected, and an amorphous oxide thin film with an appropriate density, electromechanical coefficient, and others is selected for bonding of electronic devices using radio waves, ultrasonic waves, or the like.

(4) Surface Roughness of Amorphous Oxide Thin Film

In order to achieve strong bonding, the bonding interface between the amorphous oxide thin films (first and second oxide thin films) and the amorphous oxide thin film and the smooth surface of the other substrate must be bonded over a wider area.

However, if the surface of the amorphous oxide thin film is uneven, only the contact area between the convex portions will be bonded in a point contact state, resulting in a narrow bonding area and low bonding strength even if bonding is possible.

Furthermore, in oxides, the binding energy of oxygen to metal and semi-metal elements, which are the oxide-forming elements, is large, so the transferred atoms are immediately trapped by nearby atoms of different species. Therefore, the travel distance of the atoms is very short, and if only a small gap is generated at the bonding interface, the atoms are trapped by the above-described different atoms on the surface of the same thin film in this area, making it difficult for chemical bonding to occur at the bonding interface with the different atoms of the other oxide film (or substrate).

Amorphous oxide thin films, because of their amorphous structure, differ from thin films with a crystalline structure in that their atoms exist randomly. However, like stable crystalline oxides, their composition based on stoichiometry is often stable even in an amorphous structure, and it is still difficult for atoms to migrate.

Therefore, the surface of the amorphous oxide thin film is preferably able to make contact with the entire area of the film surface at the atomic level during bonding so that atoms can move over a wide area of the bonding interface and bond with sufficient strength.

Such atomic-level contact can be achieved by making the surface roughness (arithmetic mean height Sa) of the amorphous oxide thin film as large as that of a unit cell when the oxide constituting the amorphous oxide thin film is crystalline.

Table 2 below shows the crystal structures and lattice constants of typical oxides.

As is clear from Table 2, the lattice constants of the typical oxides listed below are from 0.3 to 0.5 nm. In order to make the surface roughness of the amorphous oxide thin film as large as the unit cell of the oxide, the surface roughness should be 0.5 nm or less, which is the upper limit of the numerical range of the lattice constant, preferably sufficiently smaller than 0.5 nm, and even more preferably 0.3 nm or less, which is the lower limit of the numerical range of the above lattice constant, thereby making the contact at the bonding interface at the atomic level.

TABLE 2

Crystal structures and lattice constants of typical oxides

| Composition | $TiO_2$ | $ZrO_2$ | ZnO | MgO |
|---|---|---|---|---|
| Crystal structure | Tetragonal (rutile type) | Tetragonal | Hexagonal (6 mm) | Tetragonal |
| Lattice constant (nm) | a = 0.459 c = 0.296 | a = 0.515 | a = (b =)0.325 c = 0.521 | a = 0.421 |

(5) Film Formation Method

The method for forming an amorphous oxide thin film is not particularly limited as long as it is a vacuum film forming method capable of forming an oxide thin film having an amorphous structure on a smooth surface of a substrate in vacuum, and the amorphous oxide thin film may be formed by various known methods.

The amorphous oxide thin film formed by such a vacuum film forming method has many structural defects inside the film due to the rapid cooling (quenching) of high-temperature gas-phase and liquid-phase atoms that reach the smooth surface of the substrate during film formation, which makes it easy for atoms to move, and therefore easy for chemical bonding to occur at the bonding interface.

In particular, the thin film can incorporate a large amount of oxygen deficiency and supersaturated oxygen, and sputtering, which is easy to control these elements, and vapor deposition in combination with oxygen plasma (oxygen radicals) can be suitably used for the formation of the amorphous oxide thin film in the present invention.

When forming an amorphous oxide thin film by sputtering or vapor deposition in combination with oxygen plasma (oxygen radicals), the starting material for film formation itself may be an oxide by, for example, sputtering an oxide target or vapor depositing an oxide solid. Alternatively, an amorphous oxide thin film may be formed on a smooth surface of a substrate by, for example, depositing the oxide produced by reacting an oxide-forming element with oxygen in a vacuum vessel, or reactive sputtering.

It is also possible to increase the number of defects inside a film by controlling oxygen deficiency and supersaturated oxygen to increase the atomic mobility and thereby improve the bonding performance, and it is also possible to form a film under conditions where only a few atomic layers of the surface layer of the amorphous oxide thin film are in such a defect-rich state.

In general, the surface roughness of amorphous oxide thin films increases as the thickness increases. Therefore, when it is necessary to form a relatively thick amorphous oxide thin film, the film may be formed using the energy treatment sputtering (ETS) method, in which sputtering deposition and ion etching are performed simultaneously, to obtain an amorphous oxide thin film with the above-described surface roughness (arithmetic mean height Sa). This ETS method enables the formation of thick amorphous oxide thin films while maintaining small surface roughness.

The ETS method also has significant industrial advantages, such as the ability to form thick oxide thin films with small surface roughness even when the surface roughness of the substrate is relatively large, and the elimination of the need for high-precision polishing of the substrate surface.

(6) Degree of Vacuum

Impurity gases such as oxygen, water, and carbon remaining in the vacuum vessel are incorporated into the amorphous oxide thin film to be formed, and degrade the physical properties of the oxide thin film.

In addition, when impurity gases such as oxygen, water, and carbon in the vacuum vessel are adsorbed on the surface of the formed amorphous oxide thin film, they stabilize the chemical state of the surface and inhibit the chemical bonding of the amorphous oxide thin film at the bonding interface.

Therefore, the ultimate vacuum of the vacuum vessel must be better than $10^{-3}$ Pa, which is equal to or less than one hundredth of $10^{-1}$ Pa where the mean free path of residual gas is equal to the size of the vacuum vessel.

In order to suppress gas adsorption on the surface of the amorphous oxide thin film, ultimate vacuum is more preferably better than $10^{-4}$ Pa, which is equivalent to 1 Langmuir.

It is even better and more ideal to perform thin film deposition and bonding in an ultra-high vacuum environment of $10^{-6}$ Pa or lower, while maintaining the purity of the oxygen and other additive gases.

(7) Thickness of Amorphous Oxide Thin Film to Be Formed

In order to obtain the physical properties of an amorphous oxide thin film, the thickness of the film must be at least equal to or greater than the lattice constant (from 0.3 to 0.5 nm from Table 2 above) when the oxide constituting the amorphous oxide thin film to be formed is crystalline, and the lower limit is 0.3 nm, preferably 0.5 nm.

On the other hand, when insulating properties are required for an amorphous oxide thin film, a thick thin film may be required from the viewpoint of breakdown voltage. When optical properties are required for an amorphous oxide thin film, a thin film with a certain thickness may be required from the viewpoint of wavelength. However, in general film formation methods, increasing the thickness increases the surface roughness, which degrades the bonding performance.

In this regard, according to the ETS method described above, it is also possible to form amorphous oxide thin films with small surface roughness while increasing the thickness. However, a very long deposition time is required to deposit an amorphous oxide thin film of 5 µm or more, which makes it difficult to form industrially. Therefore, the upper limit of the thickness of the amorphous oxide thin film is 5 µm, preferably 1 µm.

Therefore, the thickness of the amorphous oxide thin film is preferably from 0.3 nm to 5 µm, and more preferably from 0.5 nm to 1 µm.

(8) Others

In the chemical bonding method of the present invention, bonding can also be performed by forming an amorphous oxide thin film only on the smooth surface of one substrate to be bonded, activating the surface of the smooth surface of the other substrate to make it easy to chemically bond, and superimposing the smooth surface of the one substrate on which the amorphous oxide thin film is formed.

In such a bonding method, the activation of the smooth surface of the other substrate may be performed by introducing the substrate whose smooth surface has been hydrophilically treated outside the vacuum vessel into the vacuum vessel, or by removing the oxidized or contaminated layer on the smooth surface of the other substrate by dry etching or other means in the same vacuum as that used to form the amorphous oxide thin film.

The material of the other substrate may be an oxide or a semiconductor such as Si, as long as the substrate can be activated to make the surface easy to chemically bond, and the material is not particularly limited.

Thus, by using a bonding method in which the amorphous oxide thin film is formed only on the smooth surface of one of the substrates, the amorphous oxide thin film can also be used for electrical insulation between the substrates to be bonded and for adjusting the optical properties between the substrates.

EXAMPLES

The bonding test using the chemical bonding method of the present invention is described below.

(1) Test Example 1 (Bonding Using $TiO_2$ Amorphous Thin Film)

(1-1) Test Outline

As an amorphous oxide thin film, $TiO_2$ thin film with an amorphous structure (hereinafter referred to as "$TiO_2$ thin film") was formed on the smooth surface of the substrate, and the change in surface roughness of the $TiO_2$ film formed with respect to the change in thickness was confirmed.

In addition, the following three substrates (all 2 inches in diameter) were bonded using $TiO_2$ thin film to check the bonding state and measure the bonding strength (surface free energy at the bonding interface) γ.

Substrate to be Bonded

Substrate combination 1: Quartz substrate-quartz substrate

Substrate combination 2: Sapphire substrate-sapphire substrate

Substrate combination 3: Si wafer-Si wafer

The electronegativity of titanium (Ti), an oxide-forming element in $TiO_2$ thin film, is 1.54, the difference between the electronegativity of oxygen (O) (3.44) and that of Ti (1.54) is 1.9, and the ionicity of Ti is 59.4%.

(1-2) Bonding Method

Two substrates were set in a vacuum vessel with an ultimate vacuum equal to or less than $1 \times 10^{-6}$ Pa, and a $TiO_2$ thin film was formed on the smooth surface of each of the two substrates by RF magnetron sputtering.

Following the formation of the $TiO_2$ thin film, the $TiO_2$ thin films formed on the smooth surfaces of each of the two substrates were superimposed on each other in the same vacuum as that used to form the $TiO_2$ thin film, and the substrates were bonded by pressurizing them at a pressure of about 1 MPa for 10 seconds without heating.

After bonding, the samples unheated or heat-treated in air at 100° C., 200° C., and 300° C. for 5 minutes were prepared.

Among the above-described substrates, for the bonding of the quartz substrate-quartz substrate in the substrate 1, the thickness of the $TiO_2$ thin film formed on the bonding surfaces of both substrates was varied to 2 nm, 5 nm, 10 nm, and 20 nm per side, and the bonded samples were prepared using the $TiO_2$ thin films of different thicknesses.

For the bonding of the sapphire substrate-sapphire substrate in the substrate 2 and the Si wafer-Si wafer in the substrate 3, the bonding was performed with a thickness of 5 nm per side.

(1-3) Measurement Method (1-3-1) Measurement of Surface Roughness

The change in the surface roughness of the $TiO_2$ thin film (before bonding) with respect to the change in the thickness of the $TiO_2$ thin film was measured.

The arithmetic mean height Sa (ISO 4287) was measured as the surface roughness, and the measurement was performed on a 2 µm square area by atomic force microscope (AFM).

(1-3-2) Measurement of Bonding Strength (Surface Free Energy at Bonding Interface) γ

The magnitude of the bonding strength (surface free energy of the bonding interface) γ of the substrates bonded under each of the above bonding conditions was measured using the "blade method".

Figure 23:
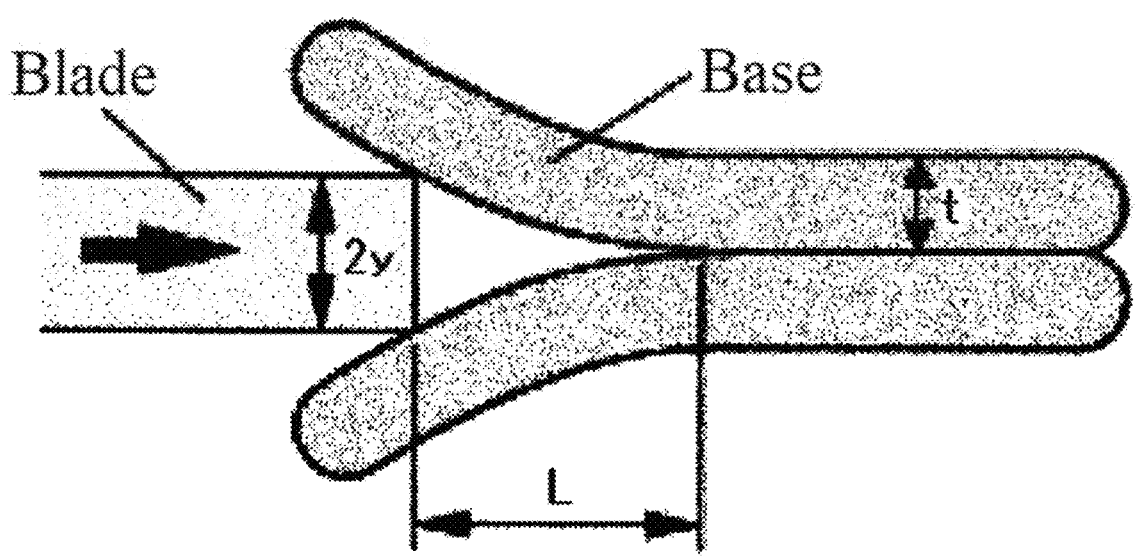
FIG. 23 illustrates the "blade method" used to measure the bonding strength (surface free energy of the bonding interface) γ.

Here, the "blade method" evaluates the bonding strength (surface free energy at the bonding interface) γ based on the peeling length L from the tip of the blade when the blade is inserted into the bonding interface of the two substrates, as indicated in FIG. 23, and the bonding strength γ is expressed by the following equation [M. P. Maszara. G. Goetz. A. Cavigila and J. B. McKitterick: J. Appl. Phys. 64 (1988) 4943]:

$$\gamma = \tfrac{3}{8} \times E t^3 y^2 / L^4$$

where E is the Young's modulus of the wafer, t is the thickness of the wafer, and y is ½ the thickness of the blade.

(1-4) Test Results (1-4-1) Surface Roughness

FIG. 1 shows the change in the surface roughness (arithmetic mean height Sa) of the $TiO_2$ thin film (before bonding) with respect to the change in the thickness of the $TiO_2$ thin film.

The arithmetic mean height Sa was the smallest at 0.18 nm for a thickness of 2 nm, and was 0.23 nm for a thickness of 20 nm, although it increased slightly as the thickness increased.

Thus, the surface roughness of the $TiO_2$ thin film used in this example is 0.5 nm or less in all cases, which is sufficiently smaller than the lattice constant of $TiO_2$ (a=0.459, c=0.296: see Table 2).

(1-4-2) Bonding Strength (Surface Free Energy of Bonding Interface) γ

Figure 2:
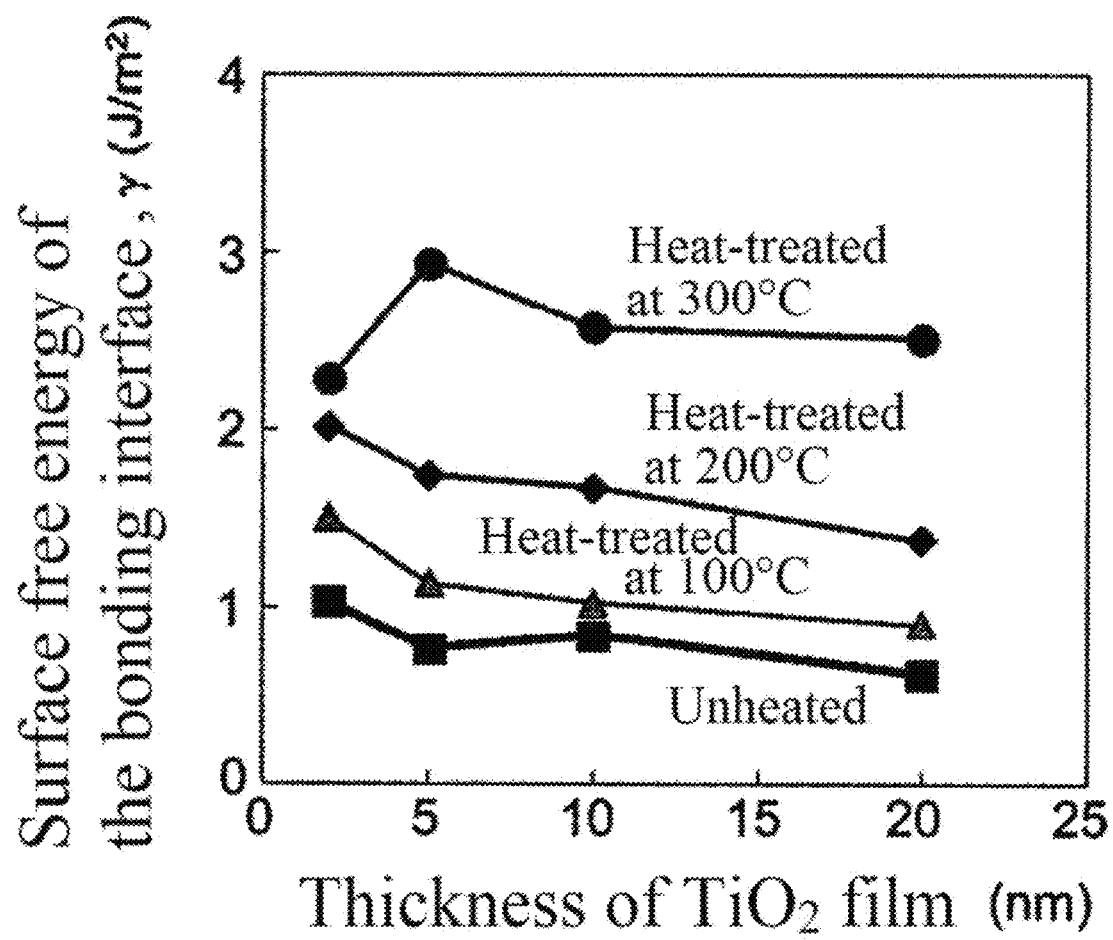
FIG. 2 shows the correlation between the thickness of an amorphous oxide thin film ($TiO_2$ thin film) and the bonding strength (surface free energy of the bonding interface) γ.

FIG. 2 shows the relationship between the magnitude of the bonding strength (surface free energy at the bonding interface) γ of the quartz substrate-quartz substrate bonded using the $TiO_2$ thin film and the change in the $TiO_2$ thin film (2, 5, 10, and 20 nm) used for bonding, for each heating condition (unheated, 100° C., 200° C., and 300° C.).

The bonding strength (surface free energy at the bonding interface) γ after bonding was from 1.0 to 0.62 $J/m^2$ even for the unheated samples, and increased as the heat treatment temperature increased. After the heat treatment at 300° C., the bonding strength γ of the samples bonded using the $TiO_2$ thin films of any thickness exceeded 2 $J/m^2$, with the highest bonding strength γ reaching 2.9 $J/m^2$ (thickness: 5 nm, heat treatment temperature: 300° C.).

It was also confirmed that the bonding of the sapphire substrate-sapphire substrate and the Si wafer-Si wafer bonded using the 5 nm thick $TiO_2$ thin film showed almost the same bonding strength γ as that of the quartz substrate-quartz substrate bonding.

In the Si wafer-Si wafer bonding, the bonding strength γ was so large that it could not be evaluated by the blade method after heat treatment at 300° C. (the blade could not enter the bonding interface, and if it was inserted forcibly, the Si wafer would break), and it was confirmed that the bonding strength γ was higher than the breaking strength of the Si wafer.

Therefore, it was confirmed that bonding using the $TiO_2$ thin film can be performed with industrially usable strength regardless of the substrate material, thickness, presence or absence of heat treatment after bonding, and heat treatment temperature.

(1-4-3) Bonding State

Figure 3:
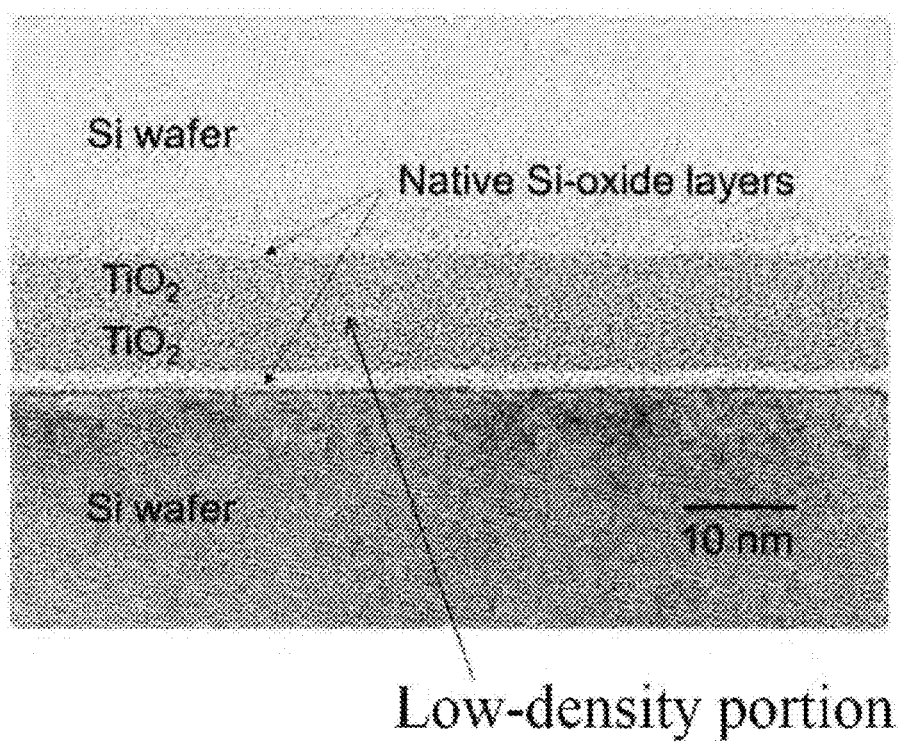
FIG. 3 shows a cross-sectional electron micrograph (TEM) of a Si wafer-Si wafer bonded using a $TiO_2$ thin film as an amorphous oxide thin film (bonded and heat-treated at 300° C. for 5 minutes).

FIG. 3 shows a transmission electron microscope (TEM) image of a sample cross section of a Si wafer-Si wafer bonded with a 5 nm thick (one side) $TiO_2$ thin film and then heat-treated at 300° C.

The layer that appears white between the Si wafer and the $TiO_2$ thin film is a natural oxide layer of Si that exists on the Si wafer surface. The bonding interface between the $TiO_2$ films (first and second oxide thin films) is bonded without gaps.

It is confirmed that there is a slight bright area at the bonding interface between the $TiO_2$ thin films, and that at the bonding interface, the density of the $TiO_2$ thin films is slightly reduced (low-density portion) near the bonding interface.

(2) Test Example 2 (Bonding Using 8 Mol % $Y_2O_3$—$ZrO_2$ Amorphous Thin Film)

(2-1) Test Outline

As an amorphous oxide thin film, $Y_2O_3$—$ZrO_2$ thin film with amorphous structure containing 8 mol % $Y_2O_3$ (hereinafter referred to as "$Y_2O_3$—$ZrO_2$ thin film") was formed, and the change in surface roughness with respect to the change in thickness was measured.

The bonding of two quartz substrates with a diameter of 2 inches was performed using $Y_2O_3$—$ZrO_2$ thin film to confirm the bonding state and to measure the bonding strength.

Here, $Y_2O_3$—$ZrO_2$ is called "stabilized zirconia". A small amount of yttria ($Y_2O_3$) was added as a stabilizer because pure zirconia ($ZrO_2$) is difficult to sinter due to the large volume change caused by the phase transition associated with high temperature changes and cracks in the material during cooling.

The electronegativity of zirconium (Zr), an oxide-forming element in $Y_2O_3$—$ZrO_2$ thin film, is 1.33, the difference between the electronegativity of oxygen (O) (3.44) and that of Zr (1.33) is 2.11, and the ionicity of Zr is 67.1%.

The electronegativity of yttrium (Y) is 1.22, the difference between the electronegativity of oxygen (O) (3.44) and that of Y (1.22) is 2.22, and the ionicity of Y is 70.8%.

(2-2) Bonding Method

Two quartz substrates were set in a vacuum vessel with an ultimate vacuum equal to or less than $1 \times 10^{-6}$ Pa, and $Y_2O_3$—$ZrO_2$ thin films were formed on the bonding surfaces of each of the two quartz substrates by RF magnetron sputtering.

Following the formation of the $Y_2O_3$—$ZrO_2$ thin film, the $Y_2O_3$—$ZrO_2$ thin films formed on the bonding surfaces of the two quartz substrates were superimposed on each other in the same vacuum as that used to form the $Y_2O_3$—$ZrO_2$ thin film, and the bonding was performed by pressurizing the quartz substrates at a pressure of about 1 MPa for 10 seconds without heating them.

The thickness of the $Y_2O_3$—$ZrO_2$ thin film on the bonding surface of the quartz substrate was varied to 2 nm, 5 nm, 10 nm, and 20 nm per side, and the surface roughness (arithmetic mean height Sa) of $Y_2O_3$—$ZrO_2$ thin films at each thickness before bonding was measured by atomic force microscopy (AFM) in the same manner as for the above-described $TiO_2$ thin film, and bonding was performed using $Y_2O_3$—$ZrO_2$ thin films formed at each thickness.

In addition, quartz substrates bonded with each of the above thicknesses were heat-treated in air for 5 minutes without heating or at 100° C., 200° C., and 300° C., respectively, and the bonding strength (surface free energy of the bonding interface) γ of each was measured by the "blade method" described above.

(2-3) Test Results (2-3-1) Surface Roughness Sa and Bonding Strength γ

The measurements of the surface roughness Sa of the $Y_2O_3$—$ZrO_2$ thin film and the bonding strength (surface free energy of the bonding interface) γ of the quartz substrates bonded under each condition are shown in Table 3 below.

TABLE 3

Surface roughness and bonding strength of $Y_2O_3$—$ZrO_2$ thin film

| | | Thickness (nm) | | | |
| --- | --- | --- | --- | --- | --- |
| | | 2 | 5 | 10 | 20 |
| Surface roughness Sa (nm) | | 0.17 | 0.19 | 0.24 | 0.27 |
| Bonding | Unheated | Unmeasurable | 1.43 | 0.45 | 0.21 |

TABLE 3-continued

Surface roughness and bonding strength of $Y_2O_3$—$ZrO_2$ thin film

| | | Thickness (nm) | | | |
|---|---|---|---|---|---|
| | | 2 | 5 | 10 | 20 |
| strength γ ($J/m^2$) | 100° C. | Unmeasurable | 1.51 | 0.53 | 0.24 |
| | 200° C. | Unmeasurable | 1.81 | 0.63 | 0.33 |
| | 300° C. | Unmeasurable | Unmeasurable | 0.76 | 0.38 |

The surface roughness Sa increased gradually as the thickness increased, however it was still 0.27 nm even at a thickness of 20 nm, and the maximum value was sufficiently small compared to 0.5 nm, and also sufficiently small compared to the lattice constant of $ZrO_2$ (a=0.515 nm: see Table 2), the main component.

In the measurement results of the bonding strength (surface free energy of the bonding interface) γ, "Unmeasurable" in Table 3 indicates that the bonding strength was so strong that it was impossible to insert a blade into the bonding interface (the quartz substrate would have broken if a blade was forcibly inserted).

For the quartz substrates bonded using a 2 nm thick $Y_2O_3$—$ZrO_2$ thin film, it has been confirmed that a large bonding strength exceeding the breaking strength of the quartz substrate, which cannot be measured by the blade method, has already been obtained in the unheated state.

For the quartz substrates bonded using 5 nm thick $Y_2O_3$—$ZrO_2$ thin films, a bonding strength γ of 1.43 $J/m^2$ was obtained immediately after bonding. The bonding strength increased with increasing the heat treatment temperature, and after heat treatment at 300° C., the bonding was so strong that it could not be evaluated by the blade method.

The bonding strength γ decreased with increasing the thickness of the $Y_2O_3$—$ZrO_2$ thin film used for bonding, and at a thickness of 20 nm, the bonding strength γ immediately after bonding was about 0.21 $J/m^2$, and even after heat treatment at 300° C., it remained at about 0.38 $J/m^2$.

Thus, the decrease in the bonding strength γ with increasing thickness is mainly due to the increase in surface roughness of the $Y_2O_3$—$ZrO_2$ thin film with increasing thickness. However, industrially usable bonding strength γ was obtained even at the maximum thickness, and it was confirmed that strong bonding could be achieved for all samples.

When the thicknesses were set to 2 nm and 5 nm, the bonding using the $Y_2O_3$—$ZrO_2$ thin film achieved a significantly larger bonding strength γ than the bonding using the $TiO_2$ thin film (Example 1).

On the other hand, when the thickness was set to 10 nm and 20 nm, the bonding strength of the bonding using the $TiO_2$ thin film was higher than that of the bonding using $Y_2O_3$—$ZrO_2$ thin film.

These results can be attributed to the higher bonding strength obtained in the $Y_2O_3$—$ZrO_2$ thin film with lower electronegativity (higher ionicity) as a result of the surface roughness Sa being almost identical between the $Y_2O_3$—$ZrO_2$ and $TiO_2$ thin films when the thickness was 2 nm and 5 nm.

On the other hand, when the thicknesses was 10 nm and 20 nm, the surface roughness Sa of the $Y_2O_3$—$ZrO_2$ thin film was larger than that of the $TiO_2$ thin film, which likely resulted in the larger bonding strength γ for the $TiO_2$ thin film.

Therefore, it was confirmed that the smaller the electronegativity (higher ionicity) of the oxide-forming elements and the smaller the surface roughness Sa of the amorphous oxide thin film, the stronger the bonding could be.

(2-3-2) Bonding State

Figure 4:
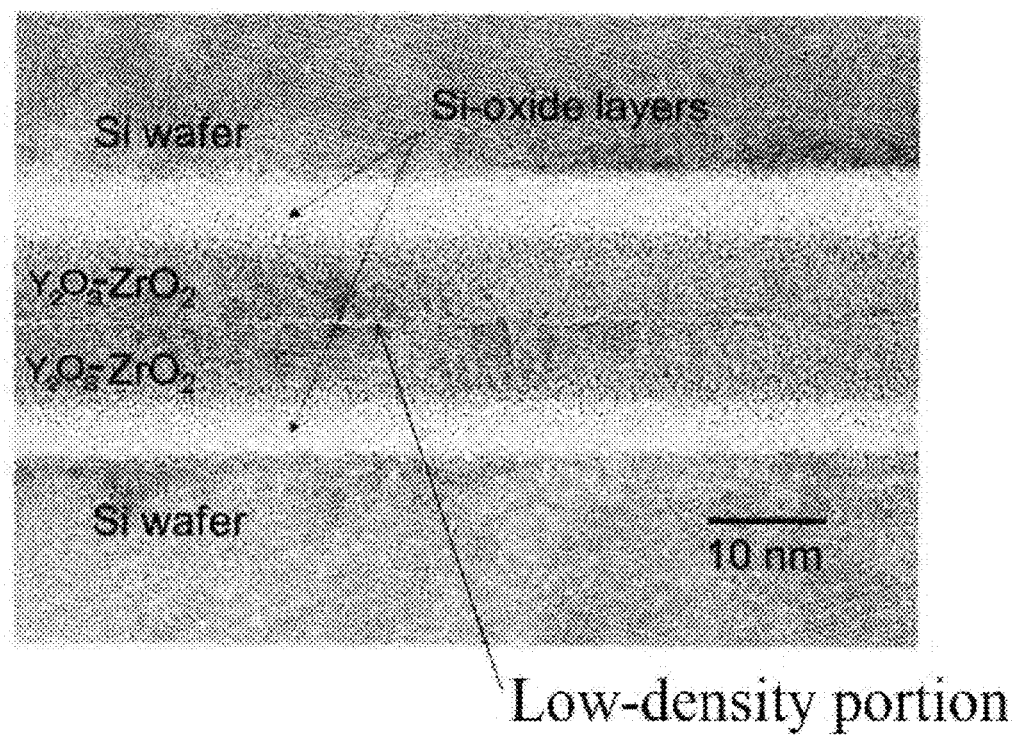
FIG. 4 shows a cross-sectional electron micrograph (TEM) of a Si wafer-Si wafer (unheated) bonded using an $Y_2O_3$—$ZrO_2$ thin film as an amorphous oxide thin film.
Figure 5:
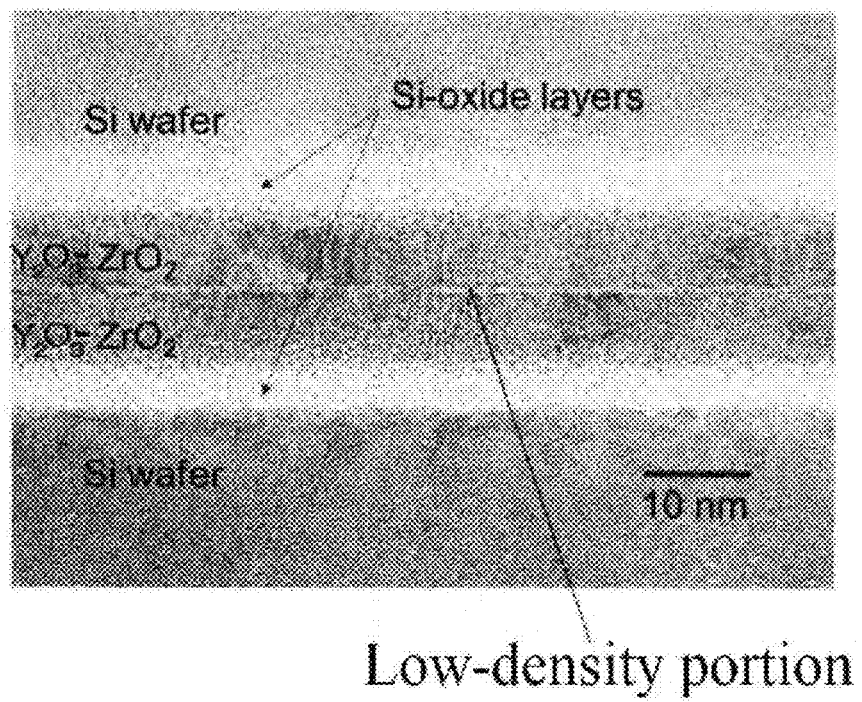
FIG. 5 shows a cross-sectional electron micrograph (TEM) of a Si wafer-Si wafer bonded using an $Y_2O_3$—$ZrO_2$ thin film as an amorphous oxide thin film (after bonding and heat treatment at 300° C. for 5 minutes).

FIGS. 4 and 5 show cross-sectional transmission electron microscopy (TEM) images of Si wafer-Si wafer samples bonded using $Y_2O_3$—$ZrO_2$ thin film with a thickness of 5 nm (one side).

FIG. 4 shows a sample in an unheated state after bonding, and FIG. 5 shows a sample that was heat-treated at 300° C. for 5 minutes in air after bonding.

In both samples, the layer that appears white between the Si wafer and the $Y_2O_3$—$ZrO_2$ thin film is Si oxide formed on the substrate surface.

In both samples, the bonding interface between $Y_2O_3$—$ZrO_2$ thin films is bonded without gaps.

It is confirmed that there is a slight bright area at the bonding interface between the $Y_2O_3$—$ZrO_2$ thin films, and that at the bonding interface, there is a low-density portion where the density of the $Y_2O_3$—$ZrO_2$ thin films is slightly reduced near the bonding interface.

In the sample without heat treatment (FIG. 4), a slightly microcrystallized area is observed in the $Y_2O_3$—$ZrO_2$ thin films.

These microcrystals were formed immediately after the film was formed, however even with the presence of such a small amount of microcrystals, bonding was possible without any problems. Therefore, it was confirmed that the amorphous oxide thin film to be formed does not necessarily have to have a completely amorphous structure, however even if it contains a small amount of crystalline material in the amorphous structure, there is no problem in bonding.

In the bonded sample using the $Y_2O_3$—$ZrO_2$ thin film, the lattice image of microcrystals in the amorphous material is continuously observed beyond the bonding interface. From this, it is confirmed that atomic diffusion occurs at the bonding interface and crystal lattice rearrangement occurs in this bonding method, and therefore, the above bonding is accompanied by atomic diffusion at the bonding interface, and the occurrence of such atomic diffusion is considered to contribute to a high-strength bonding with no gaps at the bonding interface.

Since the above-described $TiO_2$ thin film has a completely amorphous structure and there are no crystal grains, the occurrence of atomic diffusion cannot be confirmed by TEM images. However, since the bonding interface is similarly bonded without gaps and high strength bonding is obtained, it is considered that atomic diffusion at the bonding interface occurred to a small extent in the bonding using the $TiO_2$ thin film described above and in the bonding using other amorphous oxide thin films described below.

Furthermore, in the sample heat-treated at 300° C. after bonding (FIG. 5), crystallization progressed inside the $Y_2O_3$—$ZrO_2$ thin film due to the heat treatment, and it turned into an almost crystalline thin film. However, chemical bonding can be performed if the material is amorphous in the state before bonding, and crystallization after bonding is not a problem for bonding.

(3) Test Example 3 (Bonding Using $Y_2O_3$ Amorphous Thin Film)

(3-1) Test Outline

As an amorphous oxide thin film, an amorphous $Y_2O_3$ thin film (hereinafter referred to as "$Y_2O_3$ thin film") was formed, and the change in surface roughness with respect to the change in thickness was measured.

The bonding of two quartz substrates with a diameter of 2 inches was performed using $Y_2O_3$ thin film to confirm the bonding state and to measure the bonding strength.

The electronegativity of yttrium (Y), which is an oxide-forming element in the $Y_2O_3$ thin film, is 1.22, the smallest among the materials used in this application, and the difference between the electronegativity of oxygen (O) (3.44) and that of Y (1.22) is 2.22, and the ionicity of Y is 70.8%.

(3-2) Bonding Method

The $Y_2O_3$ thin films formed on the bonding surfaces of two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the $Y_2O_3$ thin film on the bonding surface of the quartz substrate was varied to 2 nm, 5 nm, 10 nm, and 20 nm per side, and the surface roughness (arithmetic mean height Sa) of $Y_2O_3$ thin films at each thickness before bonding was measured by atomic force microscopy (AFM), and bonding was performed using $Y_2O_3$ thin films formed at each thickness.

In addition, quartz substrates bonded with each of the above thicknesses were heat-treated in air for 5 minutes without heating or at 100° C., 200° C., and 300° C., respectively, and the bonding strength (surface free energy of the bonding interface) γ of each was measured by the "blade method" described above.

(3-3) Test Results (3-3-1) Surface Roughness Sa and Bonding Strength γ

The measurements of the surface roughness Sa of the $Y_2O_3$ thin film and the bonding strength (surface free energy of the bonding interface) γ of the quartz substrates bonded under each condition are shown in Table 4 below.

TABLE 4

Surface roughness and bonding strength of $Y_2O_3$ thin film

| | | Thickness (nm) | | | |
|---|---|---|---|---|---|
| | | 2 | 5 | 10 | 20 |
| Surface roughness Sa (nm) | | 0.15 | 0.15 | 0.15 | 0.20 |
| Bonding strength γ ($J/m^2$) | Unheated | Unmeasurable | Unmeasurable | 1.8 | 0.024 |
| | 100° C. | Unmeasurable | Unmeasurable | 1.9 | 0.39 |
| | 200° C. | Unmeasurable | Unmeasurable | 2.0 | 0.65 |
| | 300° C. | Unmeasurable | Unmeasurable | 2.3 | 0.95 |

The surface roughness Sa increased gradually with increasing the thickness, however it was still 0.20 nm even at a thickness of 20 nm, and the maximum value was small enough to be 0.5 nm.

In the results of the measurement of the bonding strength (surface free energy of the bonding interface) γ, for the thicknesses of 2 nm and 5 nm, a large bonding strength exceeding the breaking strength of quartz was already obtained immediately after bonding (without heating).

Even for a thickness of 10 nm, a bonding strength of 1.8 $J/m^2$ was obtained immediately after bonding (unheated), and the bonding strength γ increased with increasing the heat treatment temperature, reaching 2.3 $J/m^2$ after heat treatment at 300° C.

For a thickness of 20 nm, the bonding strength γ immediately after bonding (unheated) was about 0.024 $J/m^2$, however increased to 0.95 $J/m^2$ after heat treatment at 300° C. The difference in γ with thickness is mainly due to the difference in surface roughness.

Thus, the bonding performance of the $Y_2O_3$ thin film was superior to that of the other materials.

(3-3-2) Bonding State

Figure 6:
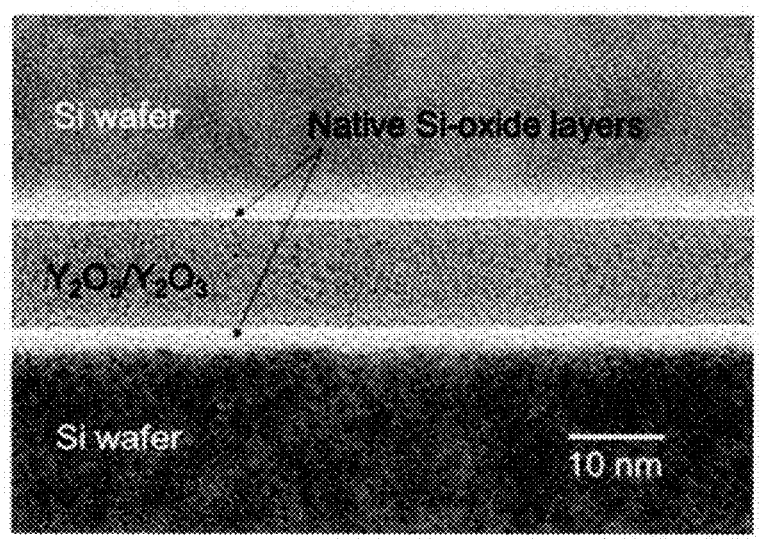
FIG. 6 shows a cross-sectional electron micrograph (TEM) of a Si wafer-Si wafer (bonded and unheated) bonded using an $Y_2O_3$ thin film as an amorphous oxide thin film.

FIG. 6 shows a cross-sectional transmission electron microscopy (TEM) image of a sample of Si wafer-Si wafer bonded with an $Y_2O_3$ thin film with a thickness of 5 nm (one side).

FIG. 6 shows a sample in an unheated state after bonding.

The layer that appears white between the Si wafer and the $Y_2O_3$ thin film is a layer of Si oxide formed on the substrate surface.

The bonding interface of the $Y_2O_3$ thin film disappeared, indicating that it has excellent bonding performance.

The $Y_2O_3$ thin film was observed to have very short range lattice fringes in some places, indicating that it was an amorphous layer containing microcrystals, and it was confirmed that the amorphous oxide thin film to be formed does not necessarily have to have a completely amorphous structure, and even if it contains a small amount of crystalline material in the amorphous structure, there is no problem in bonding.

(4) Test Example 4 (Bonding Using $Nb_2O_5$ Amorphous Thin Film)

(4-1) Test Outline

As an amorphous oxide thin film, $Nb_2O_5$ thin film with an amorphous structure (hereinafter referred to as "$Nb_2O_5$ thin film") was formed, and the change in surface roughness with respect to the change in thickness was measured.

The bonding of two quartz substrates with a diameter of 2 inches was performed using the $Nb_2O_5$ thin film to confirm the bonding state and to measure the bonding strength.

The electronegativity of niobium (Nb), an oxide-forming element in the $Nb_2O_5$ thin film, is 1.6, the difference between the electronegativity of oxygen (O) (3.44) and that of Nb (1.6) is 1.84, and the ionicity of Nb is 57.1%.

(4-2) Bonding Method

The $Nb_2O_5$ thin films formed on the bonding surfaces of the two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the $Nb_2O_5$ thin film formed on the bonding surface of the quartz substrate was varied to 2 nm, 5 nm, 10 nm, 20 nm, 30 nm, 50 nm, 75 nm, and 100 nm per side, the surface roughness (arithmetic mean height Sa) of the $Nb_2O_5$ thin film at each thickness before bonding was measured by atomic force microscopy (AFM), and bonding was performed using the $Nb_2O_5$ thin films formed at each thickness.

In addition, quartz substrates bonded with each of the above thicknesses were heat-treated in air for 5 minutes without heating or at 100° C., 200° C., and 300° C., respectively, and the bonding strength (surface free energy of the bonding interface) γ of each was measured by the "blade method" described above.

(4-3) Test Results (4-3-1) Surface Roughness Sa and Bonding Strength γ

The measurements of the surface roughness Sa of the $Nb_2O_5$ thin film and the bonding strength (surface free energy of the bonding interface) γ of the quartz substrates bonded under each condition are shown in Table 5 below.

TABLE 5

Surface roughness and bonding strength of $Nb_2O_5$ thin film

| | | Thickness (nm) | | | | | | | |
|---|---|---|---|---|---|---|---|---|---|
| | | 2 | 5 | 10 | 20 | 30 | 50 | 75 | 100 |
| Surface roughness Sa (nm) | | 0.17 | 0.17 | 0.18 | 0.18 | 0.17 | 0.17 | 0.17 | 0.17 |
| Bonding strength γ ($J/m^2$) | Unheated | 0.54 | 0.48 | 0.41 | 0.40 | 0.39 | 0.41 | 0.34 | 0.34 |
| | 100° C. | 0.77 | 0.69 | 0.57 | 0.56 | 0.50 | 0.48 | 0.46 | 0.47 |
| | 200° C. | 0.93 | 1.00 | 0.83 | 0.80 | 0.79 | 0.82 | 0.65 | 0.72 |
| | 300° C. | 1.13 | 1.37 | 1.23 | 1.20 | 1.18 | 1.22 | 0.96 | 1.07 |

Figure 7:
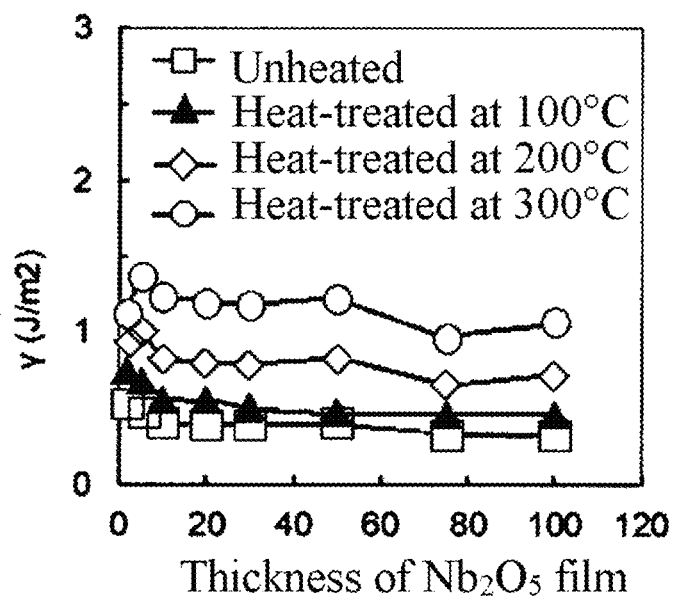
FIG. 7 shows the correlation between the change in the bonding strength (surface free energy of the bonding interface) γ with respect to the change in the thickness for quartz substrate-quartz substrate bonded using an $Nb_2O_5$ thin film.
Figure 8:
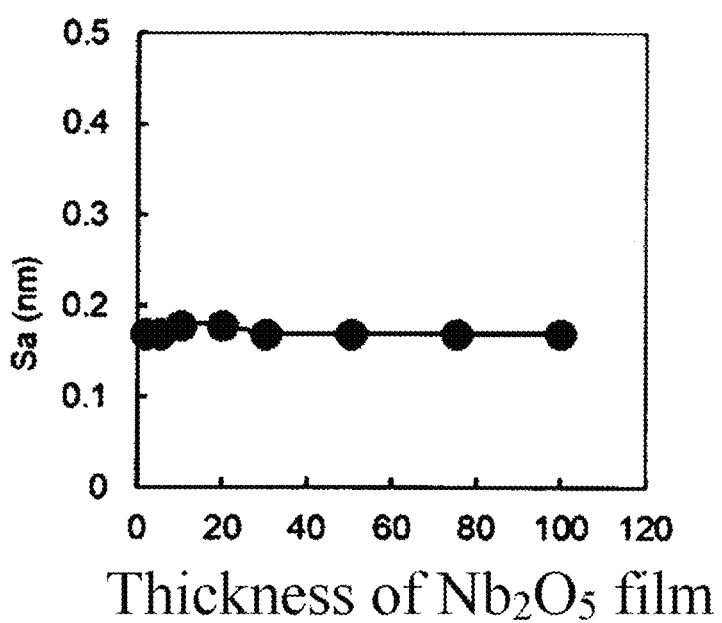
FIG. 8 shows the correlation between the change in surface roughness Sa with respect to the change in the thickness of an $Nb_2O_5$ thin film formed on a quartz substrate.

FIG. 7 shows the relationship between the thickness of the $Nb_2O_5$ thin film and the bonding strength γ, and FIG. 8 shows the relationship between the thickness of the $Nb_2O_5$ thin film and the surface roughness Sa.

The surface roughness Sa was about 0.17 nm with almost no change in the thickness from 2 nm to 100 nm, and the maximum value was sufficiently small at 0.5 nm.

The results of the measurement of the bonding strength γ showed that the values ranged from 0.34 to 0.54 $J/m^2$ immediately after bonding (unheated), however the values increased with the increase in the heat treatment temperature and reached values exceeding about 1 $J/m^2$ after heat treatment at 300° C., with the highest bonding strength γ being 1.37 $J/m^2$ (thickness: 5 nm). The change in the bonding strength γ with thickness is small, because the surface roughness Sa does not change much with respect to thickness.

Even when Si wafers were bonded using $Nb_2O_5$ thin film with a thickness of 5 nm, the same level of bonding strength γ as when the quartz substrate was bonded was obtained.

(4-3-2) Bonding State

Figure 9:
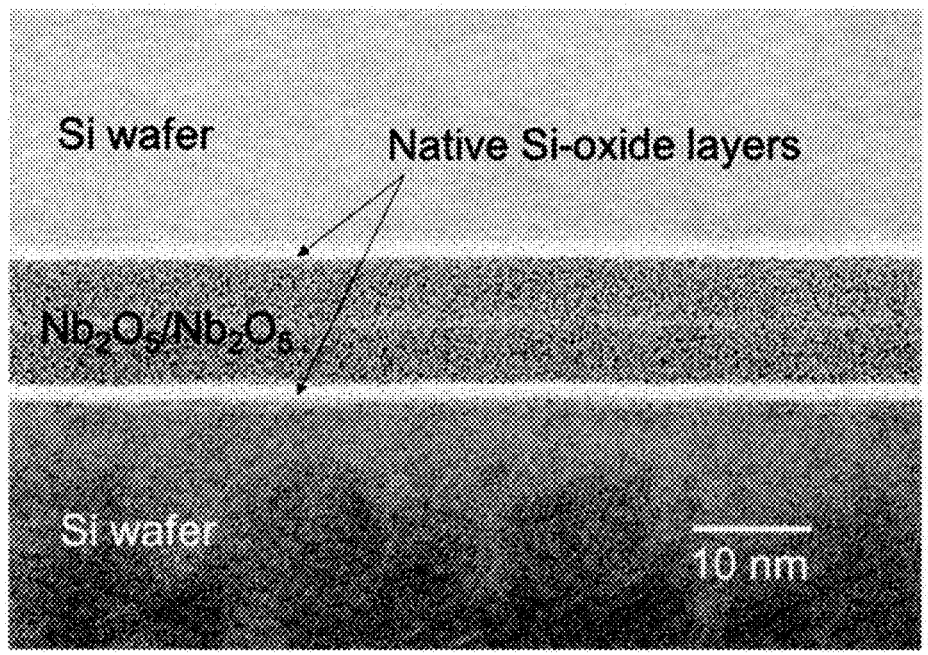
FIG. 9 shows a cross-sectional electron micrograph (TEM) of a Si wafer-Si wafer bonded using an $Nb_2O_5$ thin film as an amorphous oxide thin film (bonded and heat-treated at 300° C. for 5 minutes).

FIG. 9 shows a cross-sectional TEM photograph of a sample of a Si wafer bonded with a 5 nm thick $Nb_2O_5$ thin film and then heat-treated at 300° C.

The layer that appears white between the Si wafer and the $Nb_2O_5$ thin film is a layer of Si oxide formed on the substrate surface.

There are slightly brighter areas at the bonding interface compared to the interior of the $Nb_2O_5$ film, indicating that the density of the bonding interface is slightly lower than that of the interior of the thin film, however the bonding interface of the $Nb_2O_5$ thin film is bonded without gaps.

(5) Test Example 5 (Bonding Using $Al_2O_3$ Amorphous Thin Film)

(5-1) Test Outline

As an amorphous oxide thin film, an $Al_2O_3$ thin film with an amorphous structure (hereinafter referred to as "$Al_2O_3$ thin film") was formed, and the change in surface roughness with respect to the change in thickness was measured.

The bonding of two quartz substrates with a diameter of 2 inches was performed using the $Al_2O_3$ thin film to confirm the bonding state and to measure the bonding strength.

The electronegativity of aluminum (Al), an oxide-forming element in the $Al_2O_3$ thin film, is 1.61, the difference between the electronegativity of oxygen (O) (3.44) and that of Al (1.61) is 1.83, and the ionicity of Al is 56.7%.

(5-2) Bonding Method

The $Al_2O_3$ thin films formed on the bonding surfaces of the two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the $Al_2O_3$ thin film on the bonding surface of the quartz substrate was varied to 1 nm, 2 nm, 5 nm, and 10 nm per side, and the surface roughness (arithmetic mean height Sa) of the $Al_2O_3$ thin films at each thickness before bonding was measured by atomic force microscopy (AFM), and bonding was performed using the $Al_2O_3$ thin films formed at each thickness.

In addition, quartz substrates bonded with each of the above thicknesses were prepared and heat-treated in air without heating or at 100° C., 200° C., and 300° C. for 5 minutes, and the bonding strength (surface free energy of the bonding interface) γ of each was measured by the "blade method" described above.

(5-3) Test Results (5-3-1) Surface Roughness Sa and Bonding Strength γ

The measurements of the surface roughness Sa of the $Al_2O_3$ thin film and the bonding strength (surface free energy of the bonding interface) γ of the quartz substrates bonded under each condition are shown in Table 6 below.

TABLE 6

Surface roughness and bonding strength of $Al_2O_3$ thin film

|  |  | Thickness (nm) | | | |
| --- | --- | --- | --- | --- | --- |
|  |  | 1 | 2 | 5 | 10 |
| Surface roughness Sa (nm) |  | 0.15 | 0.15 | 0.15 (0.15) | 0.17 |
| Bonding strength γ ($J/m^2$) | Unheated | 0.50 | 0.47 | 0.43 (0.67) | 0.34 |
|  | 100° C. | 0.59 | 0.66 | 0.56 | 0.47 |
|  | 200° C. | 0.86 | 0.97 | 0.80 | 0.66 |
|  | 300° C. | 1.05 | 1.48 | 1.19 (2.45) | 1.07 |

* In Table 6, the values in parentheses are the measurements using $Al_2O_3$ thin film formed on Si wafer.

Figure 10:
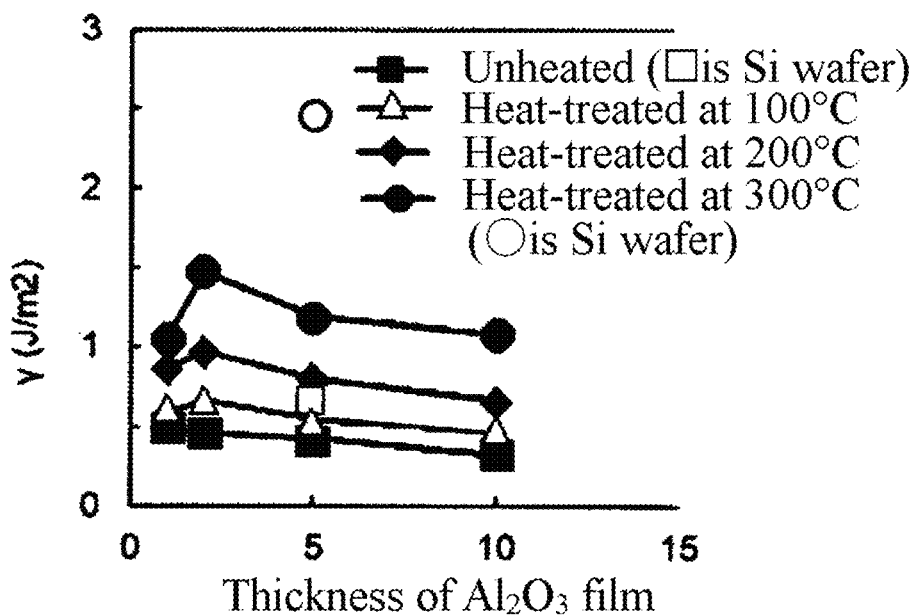
FIG. 10 shows the correlation between the change in the bonding strength (surface free energy of the bonding interface) γ with respect to the change in the thickness for quartz substrate-quartz substrate bonded using an $Al_2O_3$ thin film.
Figure 11:
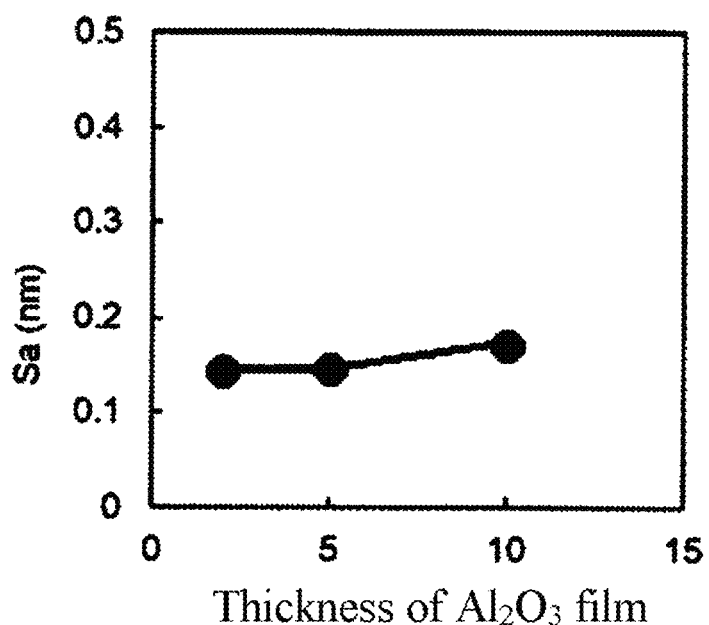
FIG. 11 shows the correlation between the change in surface roughness Sa and the change in thickness of an $Al_2O_3$ thin film formed on the quartz substrate.

FIG. 10 and FIG. 11 show the relationship between the thickness of the $Al_2O_3$ thin film and the bonding strength γ and the relationship between the thickness of the $Al_2O_3$ thin film and the surface roughness Sa, respectively.

The surface roughness Sa increased slightly with increasing the thickness, however it was still 0.17 nm at a thickness of 10 nm, and the maximum value was sufficiently small at 0.5 nm.

The results of the measurement of the bonding strength γ showed that the values ranged from 0.34 to 0.50 $J/m^2$ immediately after bonding (unheated), however the values increased with the increase in the heat treatment temperature and reached values exceeding about 1 $J/m^2$ after heat treatment at 300° C., with the highest bonding strength γ being 1.48 $J/m^2$ (thickness: 2 nm).

As shown in the results for a thickness of 5 nm, the bonding strength γ was higher for Si wafers bonded than for quartz substrates bonded both without heat treatment and heated at 300° C. In the case of Si wafer bonding, the strength reached 2.45 $J/m^2$ after heat treatment at 300° C.

(5-3-2) Bonding State

Figure 12:
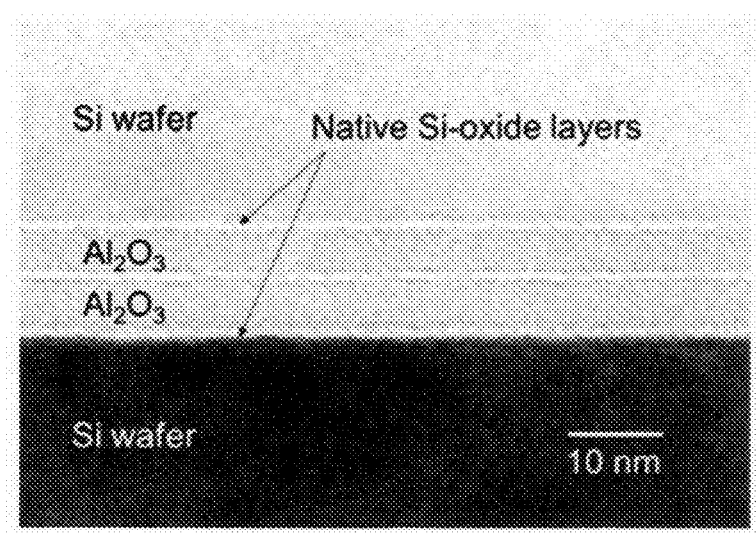
FIG. 12 shows a cross-sectional electron micrograph (TEM) of a Si wafer-Si wafer bonded using an $Al_2O_3$ thin film as an amorphous oxide thin film (bonded and heat-treated at 300° C. for 5 minutes).

FIG. 12 shows a cross-sectional TEM photograph of a sample of a Si wafer bonded using the $Al_2O_3$ thin film with a thickness of 5 nm, and then heat-treated at 300° C.

The layer that appears white between the Si wafer and the $Al_2O_3$ thin film is a layer of Si oxide formed on the substrate surface.

The bonding interface of the $Al_2O_3$ thin film appears brighter overall than the interior of the thin film, indicating that the density of the bonding interface is slightly lower than that of the interior of the thin film, however the bonding interface of the $Al_2O_3$ thin film is bonded without gaps.

(6) Test Example 6 (Bonding Using 9.7 wt % $SnO_2$—$In_2O_3$ Amorphous Thin Film)

(6-1) Test Outline

Amorphous oxide thin films of 9.7 wt % $SnO_2$—$In_2O_3$ (hereinafter abbreviated as "ITO" with the initial letters of Indium Tin Oxide) with amorphous structure were formed and the change in surface roughness with respect to the change in the thickness of the formed films was measured.

The bonding of two quartz substrates with a diameter of 2 inches was performed using the ITO thin film to confirm the bonding state and to measure the bonding strength.

The electronegativity of indium (In) and tin (Sn), which are the oxide-forming elements of the ITO thin film, are 1.78 and 1.96, respectively, and from the composition ratio of $SnO_2$ and $In_2O_3$, the electronegativity of the oxide-forming elements of the ITO thin film can be considered to be 1.81. The difference between the electronegativity of oxygen (O) (3.44) and that of the oxide-forming elements of the ITO thin film (1.81) is 1.63, and the ionicity of the oxide-forming elements is 48.5%.

The electronegativity of indium (In) is 1.78, the difference between the electronegativity of oxygen (O) (3.44) and that of In (1.78) is 1.66, and the ionicity of In is 49.8%.

(6-2) Bonding Method

The ITO thin films formed on the bonding surfaces of the two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the ITO thin film on the bonding surface of the quartz substrate was varied to 2 nm, 5 nm, and 10 nm per side, and the surface roughness (arithmetic mean height Sa) of the ITO thin films at each thickness before bonding was measured by atomic force microscopy (AFM).

In addition, quartz substrates bonded with the ITO thin films of 1 nm, 2 nm, 5 nm, 10 nm, and 20 nm in thickness per side, respectively, were prepared and heat-treated in air without heating or at 100° C., 200° C., and 300° C. for 5 minutes each, and the bonding strength (surface free energy of the bonding interface) γ of each was measured by the "blade method" described above.

(6-3) Test Results (6-3-1) Surface Roughness Sa and Bonding Strength γ

The results of measuring the surface roughness Sa of the ITO thin film and the bonding strength (surface free energy of the bonding interface) γ of the quartz substrates bonded under each condition are shown in Table 7 below.

TABLE 7

Surface roughness and bonding strength of ITO thin film

|  |  | Thickness (nm) | | | | |
| --- | --- | --- | --- | --- | --- | --- |
|  |  | 1 | 2 | 5 | 10 | 20 |
| Surface roughness Sa (nm) |  |  | 0.15 | 0.15 | 0.16 |  |
| Bonding strength γ ($J/m^2$) | Unheated | 0.68 | 0.74 | 0.52 | 0.47 | 0.43 |
|  | 100° C. | 0.82 | 0.90 | 0.74 | 0.62 | 0.62 |
|  | 200° C. | 1.00 | 1.11 | 1.00 | 0.74 | 1.11 |
|  | 300° C. | 1.23 | 1.38 | 1.73 | 1.11 | 1.11 |

Figure 13:
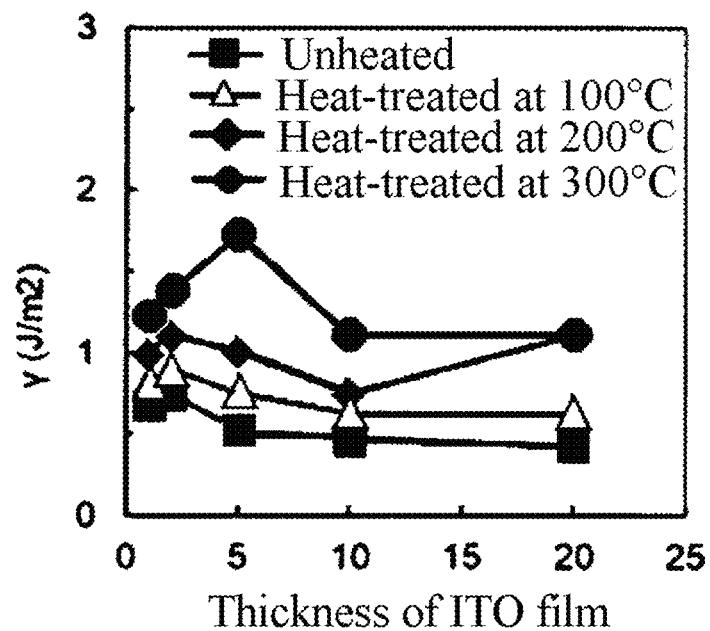
FIG. 13 shows the correlation between the change in the bonding strength (surface free energy of the bonding interface) γ with respect to the change in the thickness for quartz substrate-quartz substrate bonded using an ITO thin film.
Figure 14:
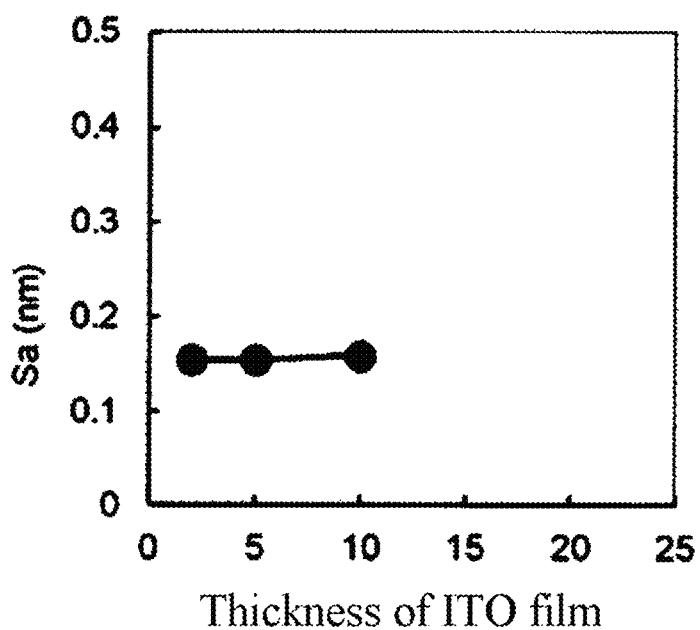
FIG. 14 shows the correlation between the change in surface roughness Sa with respect to the change in the thickness of an ITO thin film formed on a quartz substrate.

FIGS. 13 and 14 show the relationship between the thickness of the ITO film and the bonding strength γ and the relationship between the thickness of the ITO film and the surface roughness Sa, respectively.

The surface roughness Sa increased slightly with increasing the thickness, however it was still 0.16 nm at a thickness of 10 nm, and the maximum value was sufficiently small at 0.5 nm.

The results of the measurement of the bonding strength γ showed that the values ranged from 0.43 to 0.74 $J/m^2$ immediately after bonding (unheated), however the values increased with the increase in the heat treatment temperature and reached values exceeding 1 $J/m^2$ after heat treatment at 300° C., with the highest bonding strength γ being 1.73 $J/m^2$ (thickness: 5 nm).

As a result of bonding sapphire substrates and Si wafers using the ITO thin film with a thickness of 5 nm (one side), it was confirmed that the bonding strength γ was approximately the same as when quartz substrates were bonded together.

(6-3-2) Bonding State

Figure 15:
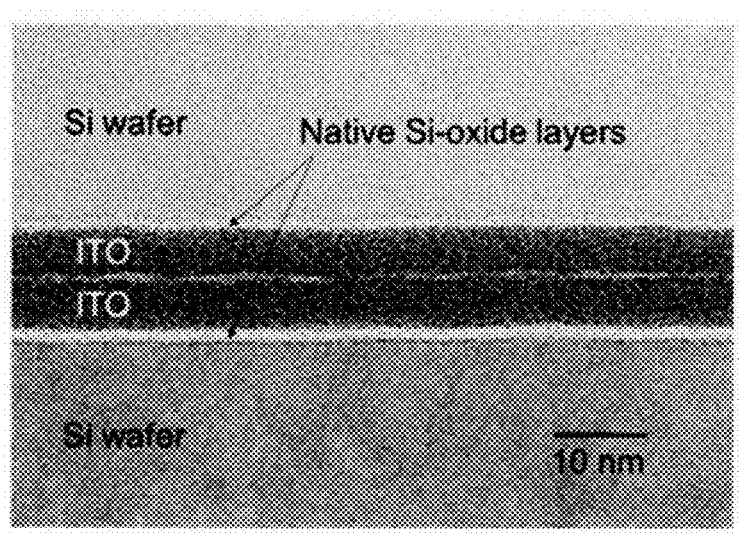
FIG. 15 shows a cross-sectional electron micrograph (TEM) of a Si wafer-Si wafer bonded using an ITO thin film as an amorphous oxide thin film (bonded and heat-treated at 300° C. for 5 minutes).

FIG. 15 shows a cross-sectional TEM photograph of a sample of a Si wafer bonded using an ITO thin film with a thickness of 5 nm, and then heat-treated at 300° C.

The layer that appears white between the Si wafer and the ITO thin film is a layer of Si oxide formed on the substrate surface.

The bonding interface of the ITO thin film appears brighter overall than the interior of the ITO thin film, indicating that the density of the bonding interface is slightly lower than that of the interior of the thin film, however the bonding interface of the ITO thin film is bonded without gaps.

The ITO thin film showed very short range lattice fringes in some places and was an amorphous layer containing microcrystals.

(7) Test Example 7 (Bonding Using $Ga_2O_3$ Amorphous Thin Film)

(7-1) Test Outline

As an amorphous oxide thin film, the $Ga_2O_3$ thin film with an amorphous structure (hereinafter referred to as "$Ga_2O_3$ thin film") was formed, and the change in surface roughness with respect to the change in thickness was measured.

The bonding of two quartz substrates with a diameter of 2 inches was performed using the $Ga_2O_3$ thin film to confirm the bonding state and to measure the bonding strength.

The electronegativity of gallium (Ga), an oxide-forming element in the $Ga_2O_3$ thin film, is 1.81, the difference between the electronegativity of oxygen (O) (3.44) and that of Ga (1.81) is 1.63, and the ionicity of Ga is 48.5%.

(7-2) Bonding Method

The $Ga_2O_3$ thin films formed on the bonding surfaces of the two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the $Ga_2O_3$ thin film on the bonding surface of the quartz substrate was varied to 1 nm, 2 nm, and 5 nm per side, and the surface roughness (arithmetic mean height Sa) of the $Ga_2O_3$ thin films at each thickness before bonding was measured by atomic force microscopy (AFM), and bonding was performed using the $Ga_2O_3$ thin films formed at each thickness.

In addition, quartz substrates bonded using the $Ga_2O_3$ thin films of each of the above-described thicknesses were heat-treated in air for 5 minutes without heating or at 100° C., 200° C., and 300° C., respectively, and the bonding strength (surface free energy of the bonding interface) γ of each was measured using the "blade method" described above.

(7-3) Test Results (7-3-1) Surface Roughness Sa and Bonding Strength γ

The results of measuring the surface roughness Sa of the $Ga_2O_3$ thin film and the bonding strength (surface free energy of the bonding interface) γ of the quartz substrates bonded under each condition are shown in Table 8 below.

TABLE 8

Surface roughness and bonding strength of $Ga_2O_3$ thin film

| | | Thickness (nm) | | |
|---|---|---|---|---|
| | | 1 | 2 | 5 |
| Surface roughness Sa (nm) | | 0.16 | 0.16 | 0.18 |
| Bonding | Unheated | 0.82 | 0.83 | 0.18 (0.40) |
| strength γ ($J/m^2$) | 100° C. | 1.00 | 1.23 | 0.37 |
| | 200° C. | 1.53 | 1.53 | 1.27 |
| | 300° C. | 2.04 | 1.93 | 2.22 (2.77) |

* In Table 8, the values in parentheses are the measurements using $Ga_2O_3$ thin film formed on Si wafer.

Figure 16:
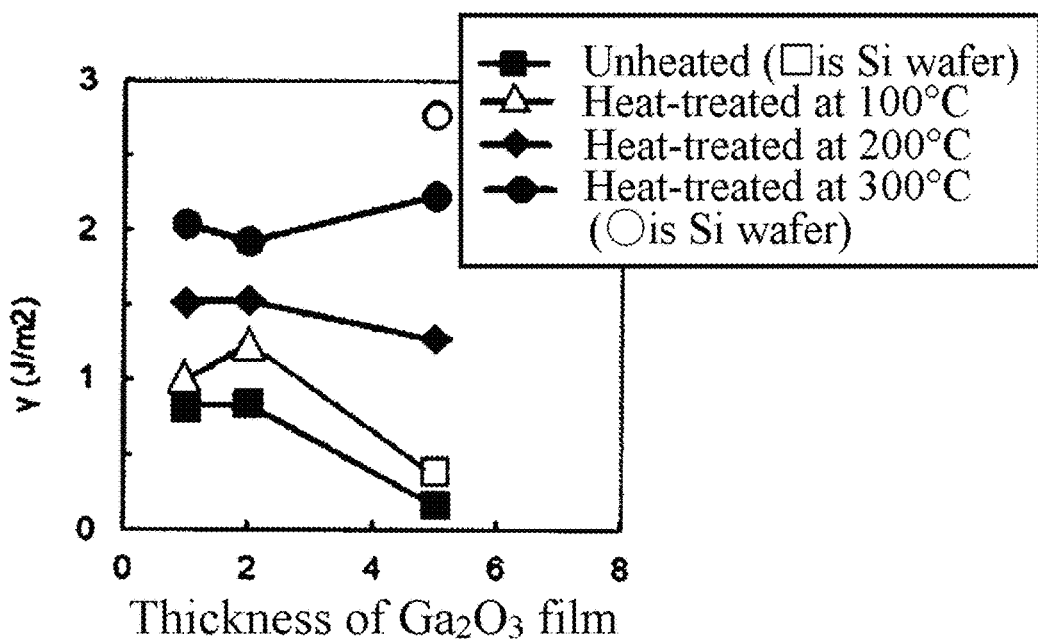
FIG. 16 shows the correlation between the change in the bonding strength (surface free energy of the bonding interface) γ with respect to the change in the thickness for quartz substrate-quartz substrate bonded using a $Ga_2O_3$ thin film.
Figure 17:
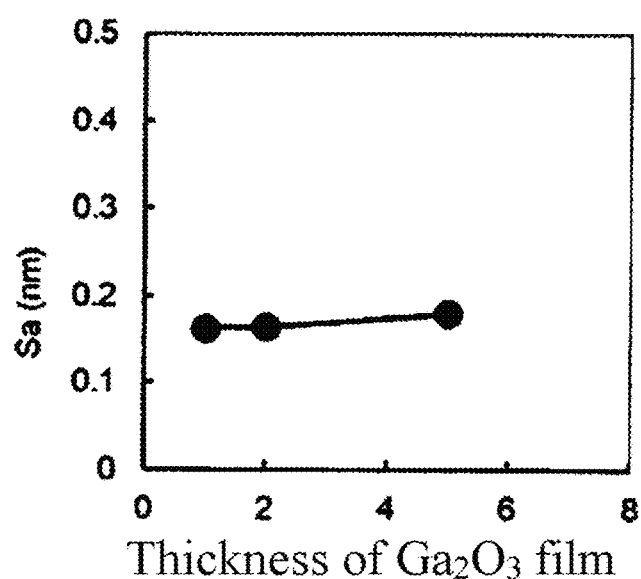
FIG. 17 shows the correlation between the change in surface roughness Sa and the change in thickness of a $Ga_2O_3$ thin film formed on a quartz substrate.

FIG. 16 shows the relationship between the thickness of the $Ga_2O_3$ film and the bonding strength γ, and FIG. 17 shows the relationship between the thickness of the $Ga_2O_3$ film and the surface roughness Sa.

The surface roughness Sa increased slightly with increasing the thickness, however it was 0.18 nm at a thickness of 5 nm, which was sufficiently small compared to 0.5 nm.

The results of the measurement of the bonding strength γ showed that the values ranged from 0.82 to 0.18 $J/m^2$ immediately after bonding (unheated), however with increasing the heat treatment temperature, the bonding strength γ increased, reaching about 2 $J/m^2$ after the heat treatment at 300° C., with the highest bonding strength γ being 2.22 $J/m^2$ (thickness: 5 nm).

The results for the thickness of 5 nm show that the bonding strength γ between the Si wafers was higher than the bonding strength γ between the quartz substrates, both for the film without heat treatment and for the film heated to 300° C. In the case of the Si wafer bonding, the bonding strength reached 2.77 $J/m^2$ after heat treatment at 300° C.

(7-3-2) Bonding State

Figure 18:
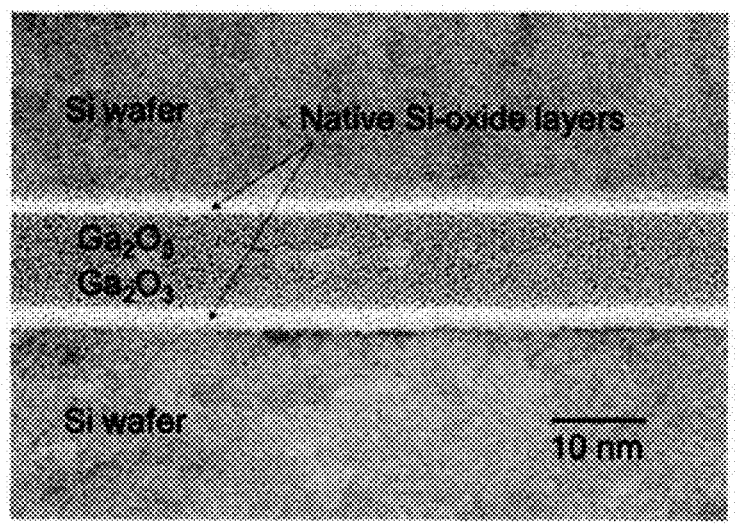
FIG. 18 shows a cross-sectional electron micrograph (TEM) of a Si wafer-Si wafer bonded using a $Ga_2O_3$ thin film as an amorphous oxide thin film (bonded and heat-treated at 300° C. for 5 minutes).

FIG. 18 shows a cross-sectional TEM photograph of a sample of a Si wafer bonded using a $Ga_2O_3$ thin film with a thickness of 5 nm, and then heat-treated at 300° C.

The layer that appears white between the Si wafer and the $Ga_2O_3$ thin film is a layer of Si oxide formed on the substrate surface.

The bonding interface of the $Ga_2O_3$ thin film appears brighter overall than the interior of the thin film, indicating that the density of the bonding interface is slightly lower than that of the interior of the thin film, however the bonding interface of the $Ga_2O_3$ thin film is bonded without gaps.

(8) Test Example 8 (Bonding Using $GeO_2$ Amorphous Thin Film)

(8-1) Test Outline

As an amorphous oxide thin film, a $GeO_2$ thin film with an amorphous structure (hereinafter referred to as "$GeO_2$ thin film") was formed. The bonding of two quartz substrates with a diameter of 2 inches was performed, the bonding state was confirmed, and the change in bonding strength γ with respect to the change in the thickness of the formed film was measured by the "blade method" described above.

The electronegativity of germanium (Ge), an oxide-forming element in the $GeO_2$ thin film, is 2.01, the difference between the electronegativity of oxygen (O) (3.44) and that of Ge (2.01) is 1.43, and the ionicity of Ge is 40%.

(8-2) Bonding Method

The $GeO_2$ thin films formed on the bonding surfaces of the two quartz substrates were superimposed on each other in the same manner as in the case of bonding using $Y_2O_3$—$ZrO_2$ thin films (Test Example 2) described above, and the bonding was performed by pressurizing the quartz substrates at a pressure of about 1 MPa for 10 seconds without heating them.

The thickness of the $GeO_2$ thin film on the bonding surface of the quartz substrate was varied to 1 nm, 2 nm, 3 nm, and 5 nm per side, and the surface roughness (arithmetic mean height Sa) of the $GeO_2$ thin films at each thickness before bonding was measured by atomic force microscopy (AFM), and bonding was performed using the $GeO_2$ thin films formed at each thickness.

In addition, quartz substrates bonded using the $GeO_2$ thin films of each of the above-described thicknesses were heat-treated in air for 5 minutes without heating or at 100° C., 200° C., and 300° C., respectively, and the bonding strength (surface free energy of the bonding interface) γ of each was measured using the "blade method" described above.

The surface roughness Sa of the $GeO_2$ thin film cannot be measured because the surface reacts with moisture in the air and agglomerates, so that the surface roughness Sa was not measured in this test example.

(8-3) Test Results (8-3-1) Surface Roughness Sa and Bonding Strength γ

The results of the measurement of the bonding strength (surface free energy of the bonding interface) γ of the quartz substrate with respect to the change in the thickness of the $GeO_2$ thin film are shown in Table 9 below.

TABLE 9

Surface roughness and bonding strength of $GaO_2$ thin film

| | | Thickness (nm) | | | |
|---|---|---|---|---|---|
| | | 1 | 2 | 3 | 5 |
| Bonding strength γ ($J/m^2$) | Unheated | 0.08 | 0.13 | 0.14 | 0.09 |
| | 100° C. | 0.57 | 0.57 | 0.58 | 0.35 |
| | 200° C. | 0.99 | 0.99 | 1.02 | 0.81 |
| | 300° C. | 1.09 | 1.21 | 1.16 (1.47) | 0.90 |

* In Table 9, the values in parentheses are the measurements using $GaO_2$ thin film formed on Si wafer.

Figure 19:
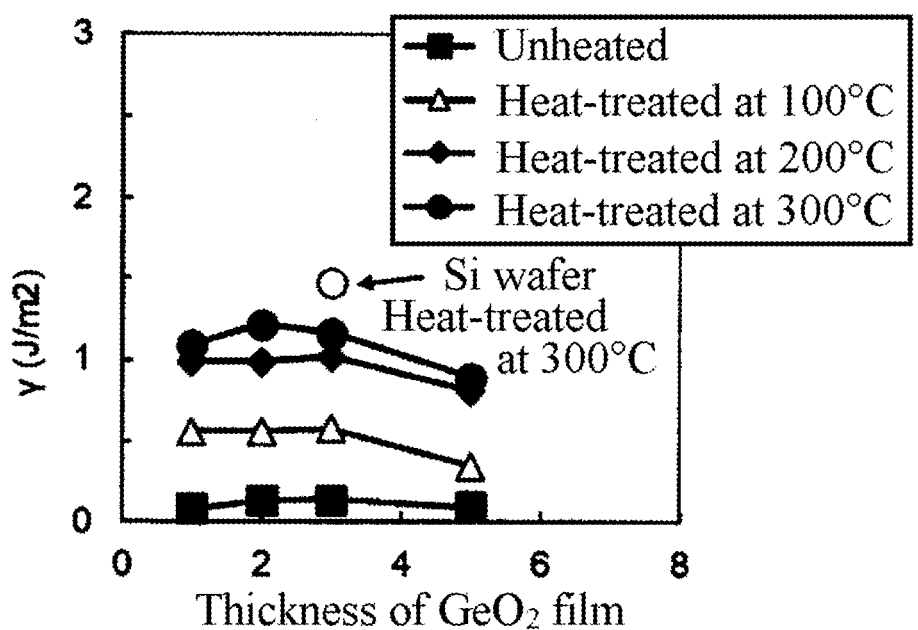
FIG. 19 shows the correlation between the change in the bonding strength (surface free energy of the bonding interface) γ with respect to the change in the thickness for a quartz substrate-quartz substrate bonded using a $GeO_2$ thin film.

FIG. 19 shows the relationship between the thickness of the $GeO_2$ thin film and the bonding strength γ.

Immediately after bonding (unheated), the bonding strength γ ranged from 0.08 to 0.14 $J/m^2$, and increased with increasing the heat treatment temperature. After heat treatment at 300° C., the bonding strength exceeded 1 $J/m^2$ in the range of from 1 to 3 nm thickness, however even the highest bonding strength γ was only about 1.21 $J/m^2$ (2 nm thickness).

However, the quartz substrates were bonded to each other regardless of the thickness.

As a result of bonding Si wafers using the $GeO_2$ thin film with a thickness of 3 nm (one side), the bonding strength was 1.47 $J/m^2$ after heat treatment at 300° C., which was slightly higher than that of bonding quartz substrates, however Si wafers were still bonded in this configuration.

Germanium, the oxide-forming element of the $GeO_2$ thin film, has the highest electronegativity of 2.01 (the difference from the electronegativity of oxygen is the smallest at 1.43) and the lowest ionicity of 40.0% among the oxide-forming elements of amorphous oxide thin films used in the experiments. Therefore, from the examples of successful bonding using the $GeO_2$ thin film, it is confirmed that bonding can be performed using an amorphous oxide thin film containing an oxide-forming element with a difference of about 1.4 in electronegativity from oxygen and ionicity of about 40%.

(8-3-2) Bonding State

Figure 20:
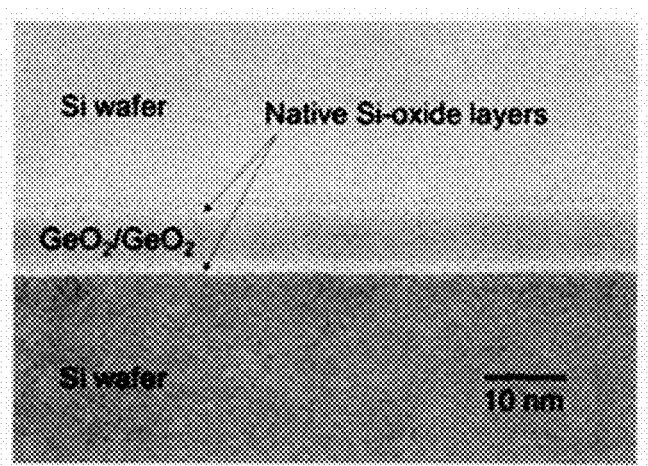
FIG. 20 shows a cross-sectional electron micrograph (TEM) of a Si wafer-Si wafer bonded using a $GaO_2$ thin film as an amorphous oxide thin film (after bonding, heat-treated at 300° C. for 5 minutes).

FIG. 20 shows a cross-sectional TEM photograph of a sample of a Si wafer bonded using a $GeO_2$ thin film with a thickness of 2 nm, and then heat-treated at 300° C.

The layer that appears white between the Si wafer and the $GeO_2$ thin film is a layer of Si oxide formed on the substrate surface.

In the sample after heating at 300° C., the bonding interface between the $GeO_2$ thin films disappeared, indicating that strong bonding was obtained. This bonding state was also consistent with the fact that the samples bonded using the $GeO_2$ thin film showed a significant increase in bonding strength of 9.3 times when heated to 300° C. compared to the unheated samples. This is because the melting point of the $GeO_2$ thin film is 1115° C., which is lower (compared to other oxides), and the effect of the heat treatment at 300° C. to promote atomic diffusion at the bonding interface is relatively greater than that of other oxide thin films.

(9) Test Example 9 (Comparison of Types of Amorphous Oxide Thin Films and Bonding Strength)

(9-1) Test Outline

As an amorphous oxide thin film, in addition to the amorphous oxide thin films used in Test Examples 1 to 8, $SiO_2$ thin films with an amorphous structure (hereinafter referred to as "$SiO_2$ thin films") were also formed, and the surface roughness Sa of each film was measured and compared in the same manner as in Test Examples 1 and 2.

The bonding strength γ of quartz substrate-quartz substrates (2 inches in diameter, neither of which was heated during bonding) bonded using each thin film was measured and compared using the "blade method" described above, both when unheated and after bonding and heat treatment at 300° C. for 5 minutes in air.

(9-2) Test Results (9-2-1) Measurement Results

The surface roughness Sa of each thin film and the bonding strength γ of the quartz substrate-quartz substrate bonded using each thin film are shown in Table 10 below.

TABLE 10

Surface roughness and bonding strength of various amorphous oxide thin films

| Material Test Example No. | Electronegativity (difference from oxygen) | Ionicity (%) | Thickness (nm) | Surface roughness Sa (nm) | Bonding strength γ ($J/m^2$) | |
|---|---|---|---|---|---|---|
| | | | | | Unheated | Heated at 300° C. |
| $Y_2O_3$ (Test Example 3) | 1.22 (2.22) | 70.8 | 5 | 0.15 | Unmeasurable | Unmeasurable |

TABLE 10-continued

Surface roughness and bonding strength of various amorphous oxide thin films

| Material Test Example No.) | Electronegativity (difference from oxygen) | Ionicity (%) | Thickness (nm) | Surface roughness Sa (nm) | Bonding strength γ (J/m²) Unheated | Bonding strength γ (J/m²) Heated at 300° C. |
|---|---|---|---|---|---|---|
| $Y_2O_3$—$ZrO_2$ (Test Example 2) | 1.32* (2.12*) | 66.8* | 5 | 0.19 | 1.43 | Unmeasurable |
| $TiO_2$ (Test Example 1) | 1.54 (1/9) | 59.4 | 5 | 0.18 | 0.77 | 2.9 |
| $Nb_2O_5$ (Test Example 4) | 1.60 (1.84) | 57.1 | 5 | 0.17 | 0.48 | 1.37 |
| $Al_2O_3$ (Test Example 5) | 1.61 (1.83) | 56.7 | 2 | 0.15 | 0.47 | 1.48 |
| ITO (Test Example 6) | 1.81* (1.63)* | 48.5* | 5 | 0.15 | 0.52 | 1.73 |
| $Ga_2O_3$ (Test Example 7) | 1.81 (1.63) | 48.5 | 2 | 0.16 | 0.83 | 1/93 |
| $SiO_2$ | 1.9 (1.54) | 44.7 | 2 | 0.15 | 0.045 | 0.045 |
| $GeO_2$ (Test Example 8) | 2.01 (1.43) | 40.0 | 2 | — | 0.13 | 1.21 |

*The value for $Y_2O_3$—$ZrO_2$ was calculated as the weighted average of $ZrO_2$ and $Y_2O_3$, and the value for ITO was calculated as the weighted average of $SnO_2$ and $In_2O_3$.

The surface roughness Sa of the amorphous oxide thin films of both materials was small, less than 0.2 nm.

It has been confirmed that the smaller the electronegativity of the oxide-forming elements in the amorphous oxide thin film, the greater the bonding strength γ, both for the unheated and heated samples.

Comparing the unheated samples after bonding, it can be seen that the bonding strength γ tends to increase with decreasing the electronegativity of the oxide-forming elements in the amorphous oxide thin film (with increasing the difference between the electronegativity of the oxide-forming elements and that of oxygen).

In particular, for the $Y_2O_3$ thin film with the smallest electronegativity (the difference with the electronegativity of oxygen is the largest), the bonding strength γ is so large that it cannot be evaluated by the blade method even in the unheated state (exceeding the fracture strength of the quartz substrate).

With the exception of the $SiO_2$ thin film, the bonding strength γ of all the samples increased with heat treatment, and in the case of the sample using the $Y_2O_3$—$ZrO_2$ thin film, heat treatment at 300° C. increased the bonding strength to a level that could not be evaluated by the blade method.

The bonding strength γ of the samples bonded using the $SiO_2$ thin film was lower than that of the samples bonded using other amorphous oxide thin films, however the bonding was still possible.

(9-2-2) Relationship Between Electronegativity, Ionicity, and Bonding Strength γ

Figures 21A, 21B:
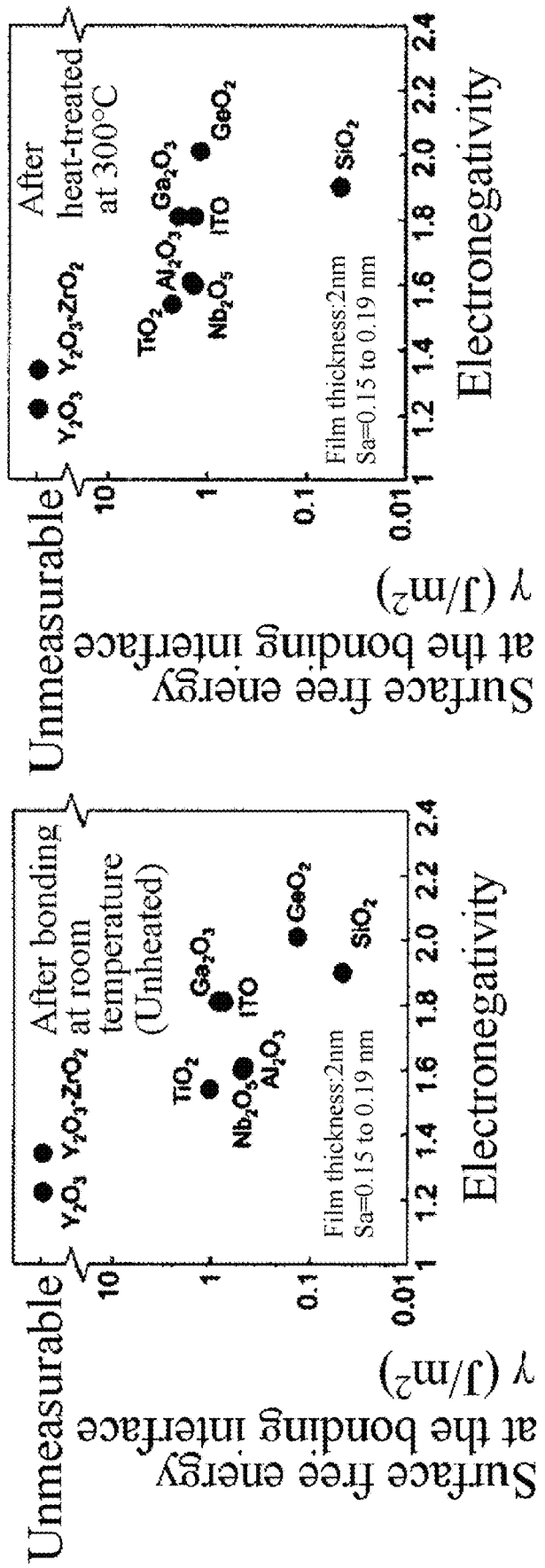
FIG. 21A shows the correlation between the electronegativity of the oxide-forming elements and the bonding strength (surface free energy at the bonding interface) γ of amorphous oxide thin films (both films are 2 nm thick) in the case where the films are unheated after bonding.
FIG. 21B shows the correlation between the electronegativity of the oxide-forming elements and the bonding strength (surface free energy at the bonding interface) γ of amorphous oxide thin films (both films are 2 nm thick) in the case where the films are heat-treated at 300° C. for 5 min after bonding.

FIGS. 21A and 21B shows the relationship between the electronegativity of the oxide-forming elements of the amorphous oxide thin films used for bonding and the bonding strength γ.

FIGS. 21A and 21B show the relationship between the electronegativity and the bonding strength γ of the samples after bonding at room temperature and unheated, and after bonding at room temperature and heat treatment at 300° C. for 5 minutes, respectively.

FIGS. 21A and 21B both show the values of the bonding strength γ when quartz wafers are bonded using an amorphous oxide thin film with a thickness of 2 nm (one side).

As can be seen from FIGS. 21A and 21B, the bonding strength γ increased with decreasing the electronegativity (the difference in electronegativity from oxygen increased), and in particular, the bonding strength of $Y_2O_3$ and $Y_2O_3$—$ZrO_2$, which have the smallest electronegativity among the examples (the difference in electronegativity from oxygen is large), both exceeded the breaking strength of quartz at a thickness of 2 nm, both when unheated and when heated at 300° C., and the bonding strength γ could not be measured (however, at a thickness of 5 nm, the bonding strength of $Y_2O_3$—$ZrO_2$ could not be measured only when heated to 300° C.: see Table 10).

Of these, bonding using $Y_2O_3$ thin film, which has the lowest electronegativity (the largest difference from the electronegativity of oxygen), has excellent bonding performance, as the bonding interface disappears even immediately after bonding (unheated), as described with reference to FIG. 6.

On the other hand, although the bonding strength γ decreased with increasing the electronegativity (the difference in electronegativity with oxygen decreased), the $GeO_2$ films with an electronegativity of 2.01 (the difference in electronegativity with oxygen is about 1.43), which corresponds to an ionic crystallinity of 40%, could be bonded either unheated or heated to 300° C. after bonding. This indicates that bonding is possible as long as the electronegativity is 2 or less (the difference in electronegativity with oxygen is about 1.4 or more).

FIG. 21B shows that the bonding strength γ increases with heat treatment at 300° C. The tendency for the bonding strength γ to decrease as the electronegativity increases is similar to the unheated case shown in FIG. 21A.

For materials with large electronegativity, such as $GeO_2$ and ITO, heating at 300° C. significantly increased the bonding strength by 9.3 times for $GeO_2$ and 3.3 times for ITO compared to the unheated condition. Especially for $GeO_2$, it has been confirmed that the bonding was accompanied by atomic diffusion to the extent that the bonding interface disappeared, as described with reference to FIG. 20.

The reason for the increase in the bonding strength γ of the material with large electronegativity by the heat treatment at 300° C. is thought to be that the melting point tends to be lower for the material with large electronegativity.

This is because the lower the melting point (i.e., the higher the electronegativity), the greater the effect of promoting atomic diffusion at the bonding interface, and the greater the rate of increase in bonding strength, even when the same heat treatment at 300° C. is applied.

As an example, the melting points of $GeO_2$ and ITO, for which the rate of increase in the bonding strength γ by heat treatment was large, were 1115° C. for $GeO_2$ and about 900° C. for ITO, respectively, which is less than half of the melting point of $Y_2O_3$ (2425° C.), which has the smallest electronegativity among the examples.

Figure 22A:
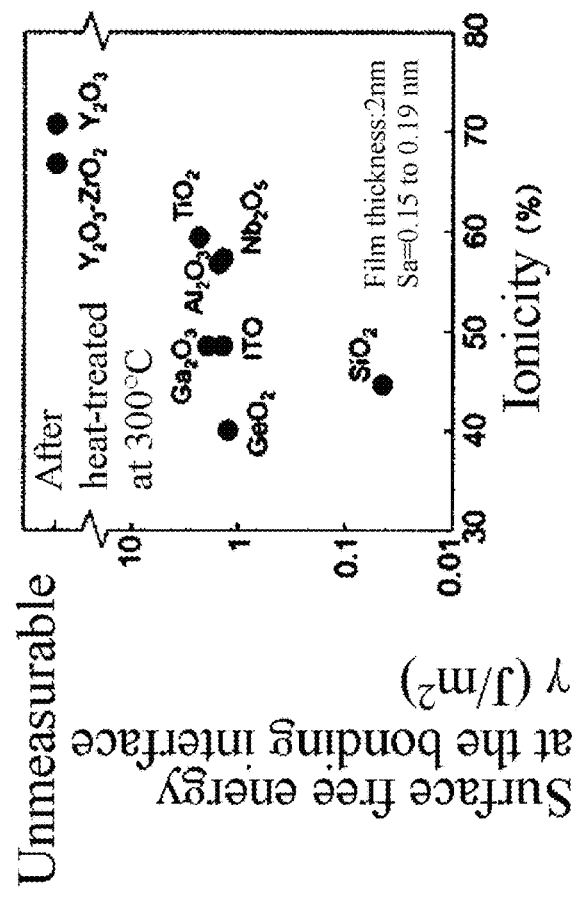
FIG. 22A shows the correlation between the ionicity (%) of the oxide-forming elements and the bonding strength (surface free energy at the bonding interface) γ of amorphous oxide thin films (both films are 2 nm thick) in the case where the films are unheated after bonding.
Figure 22B:
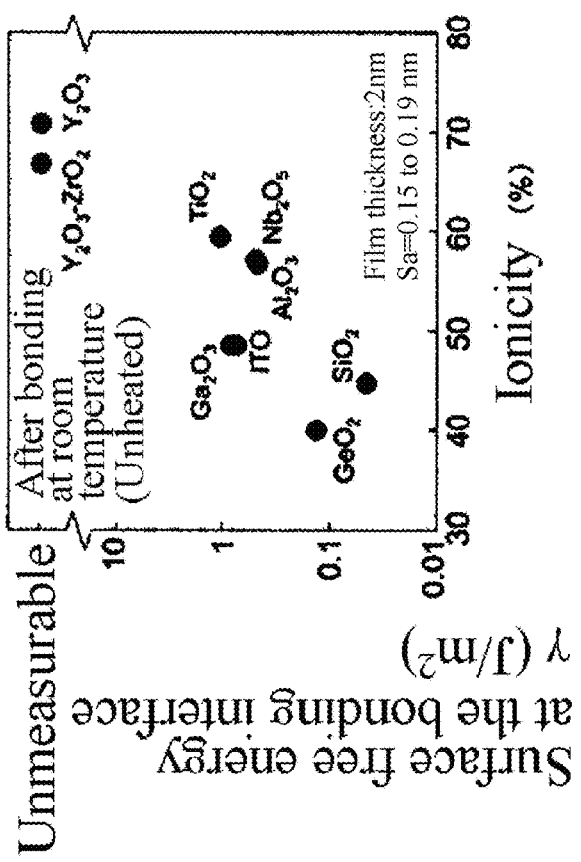
FIG. 22B shows the correlation between the ionicity (%) of the oxide-forming elements and the bonding strength (surface free energy at the bonding interface) γ of amorphous oxide thin films (both films are 2 nm thick) in the case where the films are heat-treated at 300° C. for 5 min after bonding.

FIGS. 22A and 22B shows the relationship between the ionicity of the oxide-forming elements in the amorphous oxide thin films used for bonding and the bonding strength γ.

FIG. 22A and FIG. 22B show the relationship between the ionicity and bonding strength γ of the samples after bonding at room temperature and unheated, and after bonding at room temperature and heat treatment at 300° C. for 5 minutes, respectively.

FIGS. 22A and 22B both show the values of bonding strength γ when quartz wafers are bonded using an amorphous oxide thin film with a thickness of 2 nm (one side).

As indicated in FIGS. 22A and 22B, the bonding strength γ increased as the ionicity increased, and in particular, the bonding strength of $Y_2O_3$ and $Y_2O_3$—$ZrO_2$, which have the largest ionicity among the examples, exceeded the breaking strength of quartz in both unheated and heating at 300° C. at a thickness of 2 nm, and the bonding strength γ could not be measured (however, at a thickness of 5 nm, the $Y_2O_3$—$ZrO_2$ bonding strength could not be measured only at heating at 300° C.: see Table 10).

Of these, the bonding using $Y_2O_3$ thin film, which exhibited the maximum ionicity of 70.8%, has excellent bonding performance, as the bonding interface disappears even immediately after bonding (unheated), as explained in FIG. 6.

On the other hand, although the bonding strength γ decreases with decreasing the ionicity, it was confirmed from the bonding example using the $GeO_2$ thin film (Test Example 8) that bonding is possible up to an ionicity of about 40%.

FIG. 22B shows that the bonding strength γ increases with heat treatment at 300° C. The tendency for the bonding strength γ to decrease with decreasing ionicity is similar to the unheated case shown in FIG. 22A.

For materials with small ionicity, such as $GeO_2$ and ITO, heating at 300° C. resulted in a significant increase in the bonding strength γ compared to the unheated case. This significant increase in the bonding strength γ is thought to be due to the fact that the melting point tends to be lower for materials with smaller ionic properties, and even when the same heat treatment at 300° C. is applied, the lower the melting point (i.e., the smaller the ionic properties), the greater the effect of promoting atomic diffusion at the bonding interface, and the greater the rate of increase in the bonding strength.

The bonding strength γ of the bonding using $Ga_2O_3$ thin film was about 14 times higher when unheated and about 50 times higher when heat-treated at 300° C. than that of the bonding using the $SiO_2$ thin film, and about 6.4 times higher when unheated and 1.6 times higher when heat-treated at 300° C. than that of the bonding using the $GeO_2$ thin film. These results indicate that a significant increase in the bonding strength γ is obtained when the electronegativity is lower than the electronegativity of Ga, 1.81 (the difference in electronegativity with oxygen is higher than 1.63), or when the ionicity is higher than 48.5% (≈50%).

What is claimed is:

1. A bonded structure comprising:
   a first substrate;
   a second substrate placed opposite to the first substrate;
   an intermediate layer provided between the first substrate and the second substrate and including a first oxide thin film layered on the first substrate and a second oxide thin film layered on the second substrate;
   at least one of the first oxide thin film and the second oxide thin film of the intermediate layer being formed of oxide thin films having increased defects;
   an interface between the first oxide thin film and the second oxide thin film=being bonded by chemical bonding, and the interface comprising a low-density portion whose density is lower than that of the two oxide thin films.

2. The bonded structure according to claim 1, wherein the interface between the first oxide thin film and the second oxide thin film of the intermediate layer is bonded by chemical bonding with atomic diffusion.

3. The bonded structure according to claim 2, wherein a material constituting the oxide thin film of the intermediate layer is different from a material constituting the first substrate or the second substrate.

4. The bonded structure according to claim 3, wherein both of the first oxide thin film and the second oxide thin film of the intermediate layer being formed of oxide thin films having increased defects.

5. The bonded structure according to claim 2, wherein both of the first oxide thin film and the second oxide thin film of the intermediate layer being formed of oxide thin films having increased defects.

6. The bonded structure according to claim 1, wherein a material constituting the oxide thin film of the intermediate layer is different from a material constituting the first substrate or the second substrate.

7. The bonded structure according to claim 6, wherein both of the first oxide thin film and the second oxide thin film of the intermediate layer being formed of oxide thin films having increased defects.

8. The bonded structure according to claim 1, wherein both of the first oxide thin film and the second oxide thin film of the intermediate layer being formed of oxide thin films having increased defects.

9. A bonded structure comprising:
a first substrate;
a second substrate placed opposite to the first substrate;
an intermediate layer provided between the first substrate and the second substrate and including an oxide thin film having increased defects layered on the first substrate;
an interface between the oxide thin film of the intermediate layer and the second substrate being bonded by chemical bonding, and the oxide thin film at the bonded portion having a low-density portion whose density is lower than that of the oxide thin film.

10. The bonded structure according to claim 4, wherein the interface between the oxide thin film of the intermediate layer and the second substrate is bonded by chemical bonding with atomic diffusion.

11. The bonded structure according to claim 10, wherein a material constituting the oxide thin film of the intermediate layer is different from a material constituting the first substrate or the second substrate.

12. The bonded structure according to claim 9, wherein a material constituting the oxide thin film of the intermediate layer is different from a material constituting the first substrate or the second substrate.

* * * * *